(12) United States Patent
Hotta et al.

(10) Patent No.: US 6,709,806 B2
(45) Date of Patent: Mar. 23, 2004

(54) METHOD OF FORMING COMPOSITE MEMBER

(75) Inventors: Yasuyuki Hotta, Tokyo (JP); Toshiro Hiraoka, Fujisawa (JP); Koji Asakawa, Kawasaki (JP); Shigeru Matake, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/808,233

(22) Filed: Mar. 15, 2001

(65) Prior Publication Data

US 2002/0004180 A1 Jan. 10, 2002

(30) Foreign Application Priority Data

Mar. 31, 2000 (JP) ......... 2000-159163

(51) Int. Cl.[7] .............. G03F 7/00; C23C 26/00
(52) U.S. Cl. .......... 430/322; 430/311; 430/315; 427/96; 427/98
(58) Field of Search .............. 430/311, 315; 427/96, 98

(56) References Cited

U.S. PATENT DOCUMENTS

| | | | | |
|---|---|---|---|---|
| 3,993,802 A | * | 11/1976 | Polichette et al. | 427/304 |
| 5,049,477 A | * | 9/1991 | Nakamura et al. | 430/334 |
| 5,378,502 A | | 1/1995 | Willard et al. | 427/305 |
| 5,462,897 A | * | 10/1995 | Baum et al. | 427/98 |
| 5,498,467 A | | 3/1996 | Meola | 428/198 |
| 5,508,144 A | * | 4/1996 | Katz et al. | 430/315 |
| 5,648,201 A | * | 7/1997 | Dulcey et al. | 430/315 |
| 5,725,996 A | * | 3/1998 | Houlihan et al. | 430/322 |
| 5,731,073 A | | 3/1998 | Knott et al. | 428/304 |
| 6,022,596 A | * | 2/2000 | Baum et al. | 427/98 |
| 6,348,240 B1 | * | 2/2002 | Calvert et al. | 427/539 |

FOREIGN PATENT DOCUMENTS

| JP | 55-161306 | 12/1980 |
|---|---|---|
| JP | 7-207450 | 8/1995 |

* cited by examiner

Primary Examiner—Mark F. Huff
Assistant Examiner—Kripa Sagar
(74) Attorney, Agent, or Firm—Oblon, Spivak, McClelland, Maier & Neustadt, P.C.

(57) ABSTRACT

Disclosed is a method of manufacturing a composite member in which a conductive portion is selectively formed in an insulator. The method comprises the steps of forming a photosensitive composition layer containing a compound forming an ion-exchange group upon irradiation with light having a wavelength not shorter than 280 nm within or on the surface of an insulator, exposing selectively the photosensitive composition layer to light having a wavelength not shorter than 280 nm, forming an ion-exchange group in the exposed portion, and bonding a metal or metal ions to the ion-exchange group formed in the exposed portion of the photosensitive composition layer.

51 Claims, 4 Drawing Sheets

METHOD OF FORMING COMPOSITE MEMBER

CROSS-REFERENCE TO RELATED APPLICATIONS

This application is based upon and claims the benefit of priority from the prior Japanese Patent Application No. 2000-159163, filed Mar. 31, 2000, the entire contents of which are incorporated herein by reference.

BACKGROUND OF THE INVENTION

The present invention relates to a method of forming a composite member, in which a conductive portion is formed in an insulator, the composite member being used in, for example, a wiring board in the fields of electric appliances, electronic appliances and electric and electronic communication. The present invention also relates to a photosensitive composition and an insulating material that can be suitably used in the manufacturing method of the composite member. Further, the present invention relates to a composite member manufactured by the manufacturing method of the present invention and to a multi-layer wiring board and an electronic package including the particular composite member.

In recent years, increase in the degree of integration and miniaturization of various electric and electronic parts including a semiconductor device are being promoted. The particular tendency will be further promoted in the future without fail. In this connection, various measures are being proposed and tried in an attempt to apply a high density mounting to a printed circuit board including formation of a fine pattern and a fine pitch of a metal wiring and formation of a steric wiring.

Particularly, the steric wiring is indispensable to a high density mounting and, thus, various methods are being proposed in an attempt to manufacture a wiring board having a steric wiring. In general, the steric wirings are of a multi-layered structure such as a built-up wiring board prepared by laminating two dimensional printed wiring boards and a multi-layered wiring board. It is difficult to form a steric wiring having a free three dimensional shape. The built-up wiring board or the multi-layered wiring board has a structure that adjacent wiring layers are connected to each other by a conductive column called via. The via is formed by processing an insulating layer by a photolithography process using a photosensitive polyimide or resist, followed by selectively applying a plating to the via or by filling the via with a conductive paste. For forming a via by such a method, it is necessary to repeat a plurality of times the steps of resist coating, light exposure and etching, making the via formation highly laborious. In addition, it is difficult to improve the yield.

It is also possible to form the via by forming a through-hole (via hole) of a predetermined size in an insulating substrate constituting a printed wiring board by using a drill or a $CO_2$ laser, followed by applying plating to the via hole or by filling the via hole with a conductive paste. In these methods, however, it is difficult to form freely a fine via having a size of scores of microns or less at a desired position.

In the method disclosed in Japanese Patent Disclosure No. 7-207450, a compound having a hydrophilic group is introduced into pores of three dimensional porous film such as a PTFE film. Under this condition, the film is subjected to a light exposure in a predetermined pattern by using a low pressure mercury lamp (wave lengths of 185 nm and 254 nm), thereby forming the hydrophilic group on the three dimensional porous film. Further, a metal plating is applied to the three dimensional porous film.

In the conventional method described above, however, the material forming the three dimensional porous film is deteriorated because a light beam having a short wavelength is used for the light exposure. Also, the light for the light exposure is absorbed by the three dimensional porous film and, thus, fails to reach the inner region of the porous body, resulting in failure to form fine vias.

Further, in the conventional method described above, the PTFE forming the three dimensional porous film reacts with the light for the light exposure so as to selectively form hydrophilic groups. However, PTFE is defective in that the molding workability is low and that PTFE is costly.

Another method of forming a via is disclosed in Japanese Patent Disclosure No. 11-24977. In this method, the entire surface of a porous insulating member is impregnated with a photosensitive composition containing, for example, a photosensitive reducing agent and a metal salt. Then, a light exposure is applied in a predetermined pattern to the impregnated insulating member so as to reduce the cation of the metal salt in the light exposed portion to a metal nucleus, followed by removing by washing the photosensitive composition in the non-light exposed portion. Further, an electroless plating or a soldering is applied to the residual metal nuclei so as to form vias of a predetermined pattern.

In the method described above, however, the entire surface of the porous insulating member is impregnated with a photosensitive composition containing a metal salt as described above, making it difficult to remove completely the metal salt adsorbed on the portion corresponding to the non-exposed portion after the light exposure step. As a result, a difficulty is brought about that the metal nuclei are precipitated on undesired portions in the subsequent reducing step. Such an abnormal deposition of the metal nuclei gives rise to a problem in terms of the insulating properties between adjacent vias and between adjacent wiring layers with progress in the fine pulverization of the pattern.

Also, in the via formed in the insulating substrate by the conventional method of manufacturing a wiring board, the insulating body and the conductive portion are brought into a direct contact. In this case, since the adhesion between the insulating body and the conductive portion is poor, a problem is generated that the conductive portion is peeled off the insulating substrate during the use.

Further, where a multi-layered wiring board is prepared by laminating a plurality of wiring boards manufactured by the conventional method of manufacturing a wiring board, it is required to further improve the electrical connection between the wiring layers of the wiring boards and the conductivity of the wiring.

BRIEF SUMMARY OF THE INVENTION

An object of the present invention is to provide a method of manufacturing a composite member, which has a high degree of freedom in the design of a conductive circuit, in which deterioration of the insulating body is not brought about by the light exposure, and which is free from an abnormal deposition of a metal on the insulating body so as to form a conductive portion having a fine pattern.

Another object of the present invention is to provide a method of manufacturing a composite member, which has a high degree of freedom in the design of a conductive circuit, which permits manufacturing a composite member at a low manufacturing cost without giving adverse effects to the selectivity of the material of the insulating portion and to the molding workability, and which is free from an abnormal deposition of a metal on the insulating body so as to form a conductive portion having a fine pattern.

Another object of the present invention is to provide a photosensitive composition and an insulating material used for the manufacturing method of a composite member described above.

Another object of the present invention is to provide a composite member manufactured by the method described above.

Another object of the present invention is to provide a multi-layered wiring board comprising a composite member manufactured by the method described above.

Still another object of the present invention is to provide an electronic package using a composite member or a multi-layered wiring board manufactured by the method described above.

According to a first aspect of the present invention, there is provided a method of manufacturing a composite member in which a conductive portion is selectively formed in an insulating body, comprising:
(1) forming a photosensitive composition layer within or on the surface of said insulating body, said photosensitive composition containing a compound forming an ion-exchange group upon irradiation with light having a wavelength not shorter than 280 nm;
(2) exposing selectively the photosensitive composition layer to light having a wavelength not shorter than 280 nm so as to form ion-exchange groups in the light exposed portion; and
(3) forming the conductive portion by bonding a metal ion or metal to the ion-exchange group formed in the light exposed portion by the exposing.

According to a second aspect of the present invention, there is provided a method of manufacturing a composite member in which a conductive portion is selectively formed in an insulating body, comprising:
(1) forming a photosensitive composition layer within or on the surface of said insulating body, said photosensitive composition containing a compound having an ion-exchange group;
(2) exposing selectively the photosensitive composition layer to light having a wavelength not shorter than 280 nm so as to cause ion-exchange groups in the light exposed portion to disappear and to cause the ion-exchange groups to remain in the unexposed portion; and
(3) forming the conductive portion by bonding a metal ion or metal to be bonded to the ion-exchange group remaining in the unexposed portion after the exposing.

According to a third aspect of the present invention, there is provided a method of manufacturing a composite member in which a conductive portion is selectively formed in an insulating body, comprising:
(1) forming a photosensitive composition layer within or on the surface of said insulating body, said photosensitive composition containing a compound forming an ion-exchange group upon irradiation with light, and said compound being selected from the group consisting of an onium salt derivative, a sulfonium ester derivative, a carboxylic acid derivative and a naphthoquinone diazide derivative;
(2) exposing selectively the photosensitive composition layer to light so as to form ion-exchange groups in the light exposed portion; and
(3) forming the conductive portion by bonding a metal ion or metal to the ion-exchange group formed in the light exposed portion by the exposing.

According to a fourth aspect of the present invention, there is provided a method of manufacturing a composite member in which a conductive portion is selectively formed in an insulating body, comprising:
(1) forming a photosensitive composition layer within or on the surface of said insulating body, said photosensitive composition containing a compound having an ion-exchange group;
(2) exposing selectively the photosensitive composition layer to light so as to cause ion-exchange groups in the light exposed portion to disappear and to cause the ion-exchange groups to remain in the unexposed portion; and
(3) forming the conductive portion by bonding a metal ion or metal to the ion-exchange group remaining in the unexposed portion after the light exposure in a pattern.

According to a further aspect of the present invention, there is provided a method of manufacturing a composite member in which a conductive portion is selectively formed in an insulating body, comprising:
(1) forming a photosensitive composition layer within or on the surface of said insulating body, said photosensitive composition containing a compound forming an ion-exchange group in the presence of acid and a photo acid generating agent;
(2) exposing selectively to light and heating the photosensitive composition layer so as to form ion-exchange group in the light exposed portion; and
(3) forming the conductive portion by bonding a metal ion or metal to the ion-exchange group formed in the light exposed portion by the exposing.

It is desirable for the method of the present invention to further comprise the step of applying an electroless plating to the surface of the conductive portion formed in the third step.

According to another embodiment of the present invention, there is provided a photosensitive composition used for manufacturing a composite member, the composition containing a naphthoquinone diazide derivative and a polycarbodiimide derivative.

According to another embodiment of the present invention, there is provided a porous insulating body having the inner surface of the pore covered with a photosensitive composition containing a naphthoquinone diazide derivative.

According to another embodiment of the present invention, there is provided a composite member having a conductive portion formed on at least one of the surface and the inner region of a porous insulating body via an organic compound, wherein the amount of the organic compound, which is present between the insulating body and the conductive portion, per unit area of the surface of the insulating body is larger than the amount of the organic compound that is not in contact with the conductive portion.

According to another embodiment of the present invention, there is provided a multi-layered wiring board including a plurality of substrates that are laminated one upon the other, wherein the substrate comprises a porous insulating body having fine pores and a conductive portion formed on at least one of the surface and the inner region of the fine pore of the porous insulating body, and a layer formed of a conductive body that does not contain the component of the insulating body is formed on the outermost surface of the conductive portion of each substrate.

Further, according to still another embodiment of the present invention, there is provided an electronic package comprising a wiring board consisting of the composite body described above or a multi-layered wiring board described above and an electronic part electrically connected to the wiring board.

DETAILED DESCRIPTION OF THE INVENTION

The present invention will now be described in detail.

FIGS. 1A to 1E collectively show a method of the present invention for manufacturing a composite member, covering the case where a conductive portion is formed to extend in the planar direction and the thickness direction of a sheet-like insulating body.

FIGS. 1A to 1E are cross sectional views collectively showing schematically a method of the present invention for manufacturing a composite member.

Figure 1A:
FIGS. 1A to 1E are cross sectional views collectively showing schematically a method of the present invention for manufacturing a composite body.

In the present invention, a conductive portion having a fine pattern is formed in an insulating body by steps (1) to (3) and by steps (4) and (5) given below, if necessary. The description covers the case of using a photosensitive composition containing a compound forming an ion-exchange group upon irradiation with light. The steps (1) to (5) employed in the present invention are as follows:

Step (1): In the first step, a photosensitive composition layer 2 containing a compound forming an ion-exchange group upon irradiation with light is formed on an insulating body 1, as shown in FIG. 1A. Where a conductive pattern is formed to extend in the planar direction and the thickness direction of the insulating body 1, the conductive pattern can be formed easily with a high accuracy if the insulating body 1 is porous.

Figure 1B:
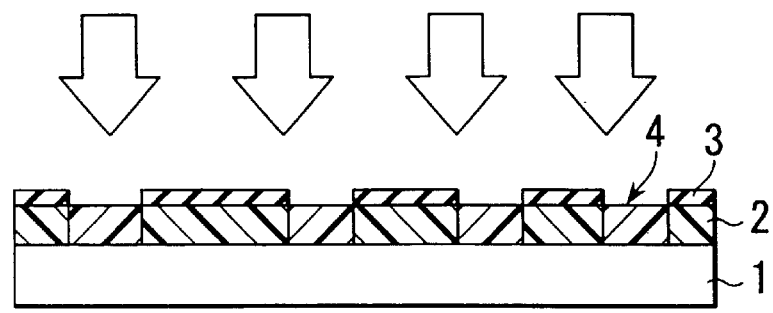

Step (2): Then, the photosensitive composition layer 2 formed on the insulating body 1 is selectively exposed to light in a pattern by using a mask 3 so as to generate ion-exchange groups in the exposed portions 4 of the photosensitive composition layer 2, as shown in FIG. 1B. Where the insulating body 1 is porous, the inner region of the insulating body 1 is also exposed to light.

Figure 1C:
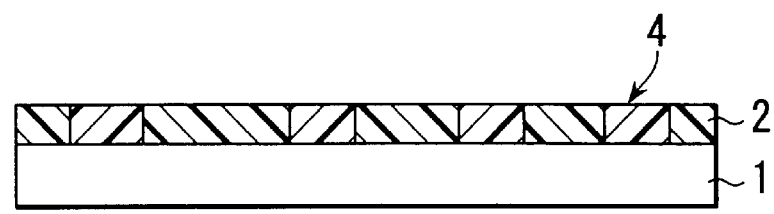

Step (3): A metal ion or a metal is bonded to the ion-exchange group formed in the exposed portion 4 exposed to light in a pattern in step (2), as shown in FIG. 1C.

Figure 1D:
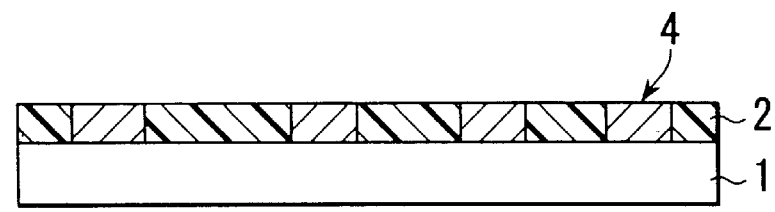

Step (4): The metal ion bonded to the ion-exchange group in the exposed portion 4 is subjected to a reducing treatment, if necessary, so as to convert the metal ion into a metal, thereby improving the conductivity, as shown in FIG. 1D.

Figure 1E:
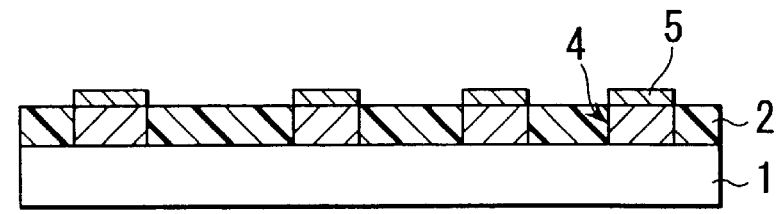

Step (5): Further, an electroless plating 5 is applied to the conductive portion formed in the exposed portion 4, if necessary, for improving the conductivity, as shown in FIG. 1E.

In the case of using a photosensitive composition containing a compound permitting the ion-exchange group to disappear upon irradiation with light, the ion-exchange group in the exposed portion disappears in step (2) so as to permit the ion-exchange group to remain on the unexposed portion, thereby forming a negative pattern.

Troublesome processes such as the resist coating, etching and peeling of the resist pattern are not included in steps (1) to (3), and steps (4) and (5), if necessary, of the method of the present invention for manufacturing a composite member. Therefore, the manufacturing process can be simplified, compared with the conventional method of manufacturing a wiring board in which a through-hole is formed by photolithography or a mechanical means. Also, if a porous body is used as the insulating body, it is unnecessary to employ the step of forming a conductive portion by a selective plating or loading of a conductive paste so as to facilitate the formation of the conductive portion. In addition, the accuracy of the pattern shape of the conductive portion can be improved, making it possible to form easily a fine pattern sized at scores of microns or less, leading to an improved degree of freedom in the design of the conductive portion formed in the insulating body.

In the manufacturing method of a wiring board disclosed in Japanese Patent Disclosure No. 11-24977, it is necessary to form a photosensitive composition layer containing a metal salt on the entire surface of an insulating body. In the present invention, however, such a process need not be employed and, thus, metal nuclei are not deposited on undesired portions. As a result, it is possible to form a conductive portion of a fine pattern accurately in only the desired portions.

In each of the first and second aspects of the present invention, a compound forming an ion-exchange group upon irradiation with light having a wavelength not shorter than 280 nm is used as a compound that permits an ion-exchange group to be formed or to disappear upon irradiation with light, and a light beam having a wavelength not shorter than 280 nm is used in the light exposure step. As a result, it is possible to suppress the damage done to the insulating body by the light irradiation and to suppress deterioration of the insulating body. The absorption of the exposure light in the insulating body is decreased. This is advantageous in forming a conductive portion extending through the insulating body in the thickness direction of the insulating body by using, particularly, a porous insulating body. Particularly, where the insulating body is formed of a polymer, it is necessary to use a heat resistant polymer for using the composite member in a wiring board. In many cases, the heat resistant polymer has an aromatic or heterocyclic structure such as a benzene ring on the backbone chain or the side chain. Such an aromatic or heterocyclic structure absorbs light in the ultraviolet region. For example, the benzene ring has an absorption peak around 254 nm. Therefore, the light having a short wavelength not longer than 280 nm is absorbed substantially completely, making it difficult to apply a light exposure in a manner to extend through the insulating body in the thickness direction of the insulating body. It is possible to form a conductive portion having a fine pattern with a high accuracy by using in the light exposure step the light having a long wavelength that is less absorbed by the aromatic or heterocyclic structure.

In the third aspect of the present invention, used is a photosensitive composition containing at least one kind of a derivative selected from the group consisting of an onium salt derivative, a sulfonium ester derivative, a carboxylic acid derivative and a naphthoquinone diazide derivative as a compound forming an ion-exchange group upon irradiation with light. The compounds enumerated above are rich in general-purpose properties and capable of forming ion-exchange groups upon irradiation with light, making it possible to form a conductive portion having a fine pattern with a high accuracy. Further, any insulating body such as a ceramic body or an organic insulating body can be coated easily with the photosensitive composition containing the particular compounds enumerated above. It follows that it is possible to use an insulating body of low cost, which is rich in the molding workability.

In the method using PTFE, which is disclosed in Japanese Patent Disclosure No. 7-207450, it is necessary to use in general a liquid such as water or alcohol as a compound having a hydrophilic group and to apply the light exposure with a porous film wetted with the liquid, giving rise to the problem that the process and the light exposure apparatus are rendered complex. In the present invention, however, such a problem is not generated, and a conductive portion can be formed easily.

A photosensitive composition containing a naphthoquinone diazide derivative and a carbodiimide derivative is used preferably in the manufacturing method of the present invention.

The naphthoquinone diazide derivative functions as a photosensitive component. It is desirable to use a derivative added to a high molecular weight compound such as a phenolic resin-added type compound as such a derivative in view of the film-forming capability. In this case, the naphthoquinone diazide derivative easily forms an ion-exchange carboxyl group with a good resolution upon irradiation with light having a wavelength not shorter than the wavelength of i-line (365 nm). Nitrogen alone is formed as a by-product during the reaction, and the nitrogen thus formed can be discharged easily to the outside of the system as a gaseous material. It follows that an adverse effect is not given to the metal ion substituting reaction and the electroless plating that are carried out in the subsequent process, as desired.

The polycarbodiimide derivative has a carbodiimide structure exhibiting a high reactivity with an active hydrogen compound contained in alcohol, thiol, amine, etc. By mixing such a polycarbodiimide derivative, the reaction with the naphthoquinone diazide derivative can be carried out easily. By the reaction between these two derivatives, the photosensitive composition layer is allowed to assume a structure that is gelled in a three dimensional direction. As a result, the photosensitive composition layer is rendered insoluble in any of an aqueous solvent and an organic solvent. In addition, the resistance to heat of the photosensitive composition layer can be improved. As a result, the bonding strength between the conductive portion and the insulating body can be improved, and it is possible to improve the resistance to chemicals and the resistance to heat of the entire composite member.

In the present invention, it is desirable to use a porous body as the insulating body. Particularly, where the inner surface of the pore of the porous body is covered with a photosensitive composition containing a naphthoquinone diazide derivative, it is possible to form a conductive portion having a pattern shape of a high accuracy by performing the process of step (2) described previously.

Where a conductive portion extending in the planar direction and the thickness direction of the insulating body is formed by the method of the present invention by using a sheet-like insulating body, it is desirable for the obtained composite member to assume the structure described below. The particular structure will now be described with reference to FIG. 2.

Figure 2:
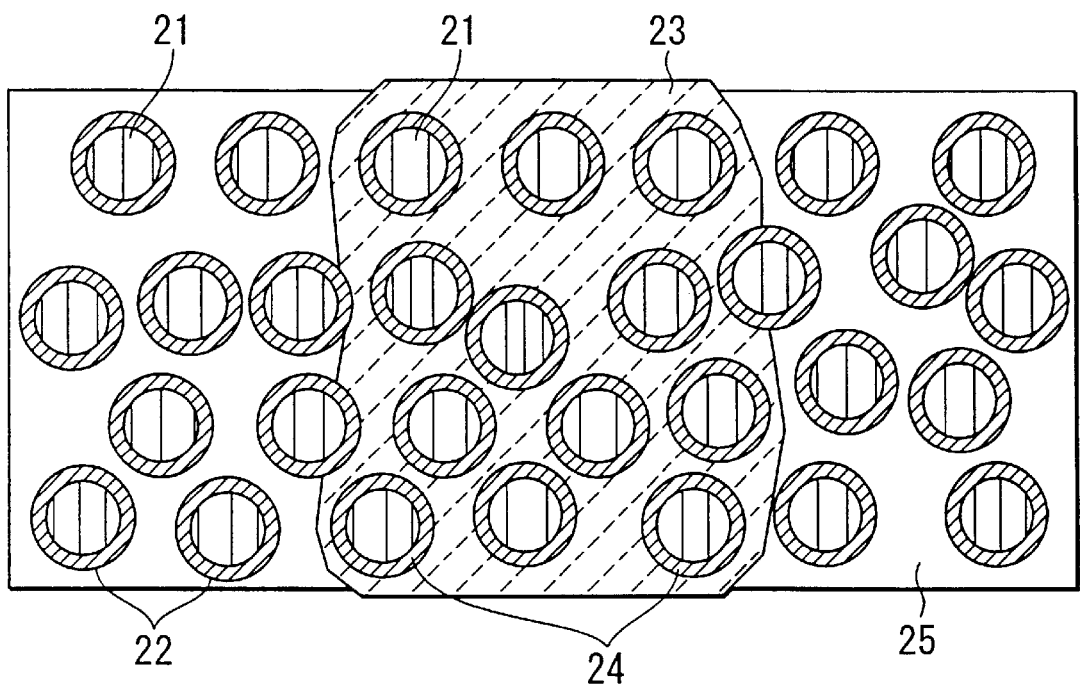
FIG. 2 schematically shows the composite body manufactured by the method of the present invention.

Specifically, FIG. 2 schematically shows an example of the composite member manufactured by the method of the present invention. As shown in FIG. 2, a photosensitive composition layer 22 containing a compound forming an ion-exchange group upon irradiation with light is formed on the surface of a porous insulating body 21. By applying a light irradiation, an organic compound 24 containing the ion-exchange group is formed in the exposed portion. Metal ions or fine metal particles formed by the ion exchange reaction or the adsorption reaction are supported on the ion-exchange group of the organic compound 24. Then, an electroless plating is applied so as to form a conductive portion 23 having a reasonable thickness. In this fashion, a composite member is manufactured by the method of the present invention. It should be noted that the organic compound 24 is strongly bonded to each of the insulating body 21 and the conductive portion 23 so as to improve the bonding strength between the insulating body 21 and the conductive portion 23. In a composite member in which the organic compound 24 is interposed between the insulating body 21 and the conductive portion 23, it is desirable for the amount of the organic compound 24 present on the surface of the insulating body 21 to meet the conditions given below. Specifically, it is desirable for the amount of the organic compound 24 present not in contact with the conductive portion 23 to be smaller than the amount of the organic compound 24 present in the interface between the insulating body 21 and the conductive portion 23. It should be noted that the hydrophilic ion-exchange group contributes to the improvement of the bonding strength between the conductive portion 23 and the insulating body 21. However, where the hydrophilic group of the organic compound is present in portions other than the portion where the conductive portion 23 is formed, migration of the metal tends to take place between the adjacent conductive portions 23. Also, the hygroscopicity is increased so as to lower the insulating properties.

It is possible to manufacture a multi-layered wiring board by using the composite member manufactured by the method of the present invention. In the first step, a conductive portion extending in the planar direction and the thickness direction of a sheet-like insulating body is formed by the method of the present invention so as to manufacture a composite member. A multi-layered wiring board manufactured by laminating a plurality of composite members thus prepared will now be described with reference to FIG. 3.

Figure 3:
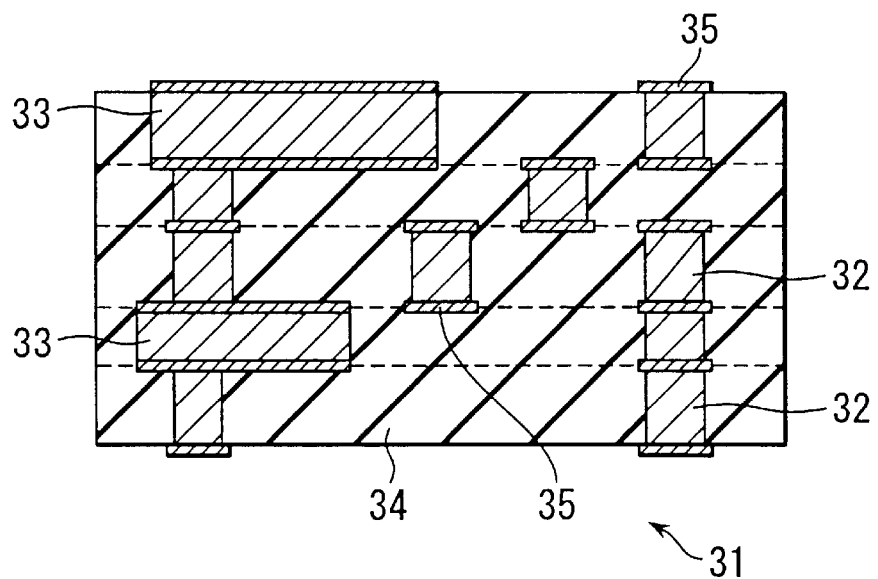
FIG. 3 schematically shows a multi-layered wiring board including a composite body, which is manufactured by the method of the present invention.

Specifically, FIG. 3 schematically shows an example of a multi-layered wiring board 31 manufactured by using composite members prepared by the method of the present invention. As shown in FIG. 3, the multi-layered wiring board 31 is prepared by laminating a plurality of porous films each consisting of an insulating body 34 provided with conductive portions such as vias 32 and a wiring 33. The via 32 and the wiring 33 are formed by loading a metal on the inner surface of the fine pore of the porous film or within the porous film. A conductive portion 35 formed of a conductive substance alone such as a metal is formed on the edge surface of the conductive portion.

To be more specific, in the multi-layered wiring board 31, a layer 35 formed of a conductor that does not contain an insulating component is formed on each of the outermost surfaces of the conductive portions 32 and 33 in the individual porous film, with the result that the resistance of the conductive portion is lowered. Particularly, in a region having a high frequency, the impedance characteristics can be improved by the skin effect of these structures.

A single composite member manufactured by the method of the present invention can be used as a wiring board without laminating a plurality of such composite members. It is also possible to obtain an electronic package by electrically connecting an electronic part to such a wiring board made of a single composite member or to a multi-layered wiring board. Since a conductive portion having a fine pattern is formed with a high accuracy in the wiring board included in the electronic package thus prepared, it is possible to achieve a high density mounting. Specific examples of the wiring board made of a single composite member and the multi-layered wiring board include, for example, a high density mounting such as a portable equipment and a micro machine, a multi-layered wiring board indispensable for the mounting of a flip chip and a ball semiconductor, and a multi-layered wiring and a three dimensional wiring suitably used for an interposer, a steric wiring, etc.

The present invention will now be described more in detail.

In the present invention, any insulating material including, for example, a resin and a ceramic material can be used as an insulating body in which conductive portions such as a wiring and a via are formed.

Specifically, the resin used in the present invention includes, for example, the resin widely used as an insulating body of a printed circuit board such as a glass epoxy resin, bismaleimide-triazine resin and PPE resin, polyolefins, acrylic polymers, polyethers such as polyallyl ether, polyesters such as polyallylate, and resins generally called engineering plastics such as polyamide and polyether sulfone.

On the other hand, the ceramic materials used in the present invention include, for example, glass, alumina, and aluminum nitride.

Where a conductive portion is formed in a three dimensional direction in the present invention, i.e., in the case of forming a conductive portion extending not only in the planar direction but also in the thickness direction of a sheet-like insulator, the conductive portion can be formed easily with a high accuracy by using a porous body consisting of an insulating material. A porous body formed of a resin can be manufactured easily by a wet method or a dry method. For example, where a porous resin sheet is prepared by a wet method, an inorganic fine powder used as a pore-forming agent and an organic solvent are added first to a resin, and the resultant mass is kneaded so as to prepare a mixture. Then, the mixture is formed into a film, followed by extracting the inorganic fine powder and the organic solvent by using a solvent. Further, the resultant film is drawn, as required.

Where a porous resin sheet is prepared by, for example, a dry method, a mixture prepared as in the case of employing a wet method is extruded to form a sheet. Then, as required, a heat treatment is applied to the resultant sheet, followed by subjecting the sheet to a uniaxial or biaxial orientation.

Where a porous resin sheet is prepared by any of the wet method and the dry method, it is possible to apply a heat treatment to the resin sheet after the orientation, as desired, for the dimensional stability. Also, a desired porous resin sheet can be obtained easily without using the additives noted above by orienting the resin sheet after formation of the resin sheet so as to make the resin sheet porous.

Also, a ceramic porous body, e.g., alumina, can be prepared by, for example, anodizing aluminum within an electrolyte.

Where a conductive portion is formed in a manner to extend in a three dimensional direction by the method of the present invention for manufacturing a composite member, i.e., where the conductive portion is formed to extend not only in the planar direction but also in the thickness direction of a sheet-like insulating body, the light exposure is applied to reach the inner region of the porous body. In this case, it is desirable for the pore diameter of the porous body to be sufficiently small relative to the wavelength of the light used for the light exposure in order to prevent the scattering of the light for the light exposure. However, if the pore diameter is unduly small, the porous body is unlikely to be impregnated with a photosensitive composition, or the light for the light exposure is unlikely to be transmitted into the porous body. Particularly, in the case of forming a wiring, it is necessary for the loaded metal to be continuous sufficiently within the pores. If the pore diameter is unduly small, however, the loaded metal tends to be separated within the pores so as to form the state of fine particles. In order to avoid such an inconvenience, it is desirable for the pore diameter of the porous body to fall within a range of between 30 nm and 2,000 nm, more preferably between 50 nm and 1,000 nm, and most preferably between 100 nm and 500 nm.

Even where the pore diameter fails to fall within the range noted above and is considerably larger than the wavelength of the light used for the light irradiation, it is possible to prevent the scattering of the light for the light exposure if a liquid having a refractive index equal or close to that of the porous body or an amorphous solid material having a low boiling point is loaded in the pore for preventing the light scattering. However, if the pore diameter is unduly large, it is difficult to fill completely the pore with a metal by means of, for example, a plating. In addition, it is difficult to form a conductive portion having a width not larger than scores of microns. What should also be noted is that a short circuiting tends to take place between adjacent layers of the composite member in the case of manufacturing a multi-layered wiring board. Under the circumstances, it is desirable for the pore diameter of the porous body to be not larger than 5 µm even in the case of using a liquid for preventing the light scattering in the step of the light exposure.

Also, it is desirable for the porous body to have pores contiguous to each other in the three dimensional direction in order to manufacture a composite member in which a conductive portion is formed in a manner to form a pattern extending in the thickness direction of the porous body, particularly, a composite member in which are formed linear portions contiguous to each other in a two dimensional direction.

Further, it is desirable for the continuous pores present within the porous body to be formed regularly and homogeneously in order to prevent the scattering of the light used for the light irradiation. This is also effective for making fine the conductive line.

Also, it is necessary for the continuous pore within the porous body to be open to the outside of the porous body, and it is desirable for the closed cell that does not have an open end open to the outside to be diminished as much as possible. Also, in order to improve the conductivity of the wiring, it is desirable for the porosity to be as high as possible within the range in which the mechanical strength of the porous body can be maintained. To be more specific, it is desirable for the porosity to be not lower than 40%, preferably not lower than 60%.

The porous body having pores contiguous to each other in a three dimensional direction can be formed by various methods. For example, it is possible to use the porous body manufactured by laminating beads, the porous body prepared by using a green sheet or a laminate structure of beads as a mold, the porous body prepared by using a laminate structure of air bubbles or liquid bubbles as a mold, a silica aerogel obtained by subjecting a silica sol to a supercritical drying, the porous body formed by removing a suitable phase from a micro phase separation structure exhibited by a polymer, the porous body prepared by removing a suitable phase from a phase separation structure such as a co-continuous phase separation structure formed by spinodal decomposition of a mixture containing a polymer, silica. It is also possible to use a porous body prepared by an emulsion templating method. Further, it is possible to use a porous body prepared by a three dimensional light-shaping method, as reported by, for example, B. H. Cumpston et al. (Nature, vol. 398, 51, 1999) and by M. Campbell et al. (Nature, vol. 404, 53, 2000).

A porous body prepared by loading a resin or a metal oxide gel in pores of the laminate structure of beads, followed by curing the loaded material and subsequently removing the beads is reported by, for example, Y. A. Vlasov et al. (Adv. Mater. 11, No. 2, 165, 1999) and by S. A. Johnson et al. (Science Vol. 283, 963, 1999).

It should also be noted that, since it is possible to manufacture a porous body having pores arranged regularly and having a high porosity with a low cost, it is desirable to use a porous body of, for example, a polymer prepared by using a laminate structure of air bubbles or liquid bubbles as a mold. The particular porous body is reported by, for example, S. H. Park et al. (Adv. Mater. 10, No. 13, 1045, 1998) and by S. A. Jenekhe et al. (Science Vol. 283, 372, 1999).

It is desirable to use a silica aerogel having a porosity of at least 90% and a pore diameter not larger than about 100 nm, which is obtained by subjecting a silica sol to a supercritical drying because the particular silica aerogel has a high porosity and is excellent in transparency.

It is most desirable to use a porous body formed from a phase separation structure exhibited by, for example, a polymer because the pore diameter can be controlled easily and because the particular porous body can be manufactured with a low cost.

It is possible to control easily the state of the inner surface of the pore of the porous body manufactured from a micro phase separation structure. To be more specific, in removing one phase of the micro phase separation structure, the phase is not completely removed such that the phase partly remains on the inner surface of the pore. As a result, it is possible to change the surface state of the inner surface of the pore. Suppose, for example, that a porous body is formed by using a triblock copolymer of A-B-C type in which the molecular weight of each of phases A and C is sufficiently large, compared with the molecular weight of phase B. Where a porous body consisting of phase A is prepared by removing phase C from the triblock copolymer, phase B is arranged on the inner surface of the pore. Therefore, it is possible to change the properties of the inner surface of the pore without markedly changing the properties of the porous body as a whole. It follows that it is possible to improve the bonding strength between the impregnated resin and the porous body. In this case, phase B and phase A are completely coupled with each other by a chemical bond and, thus, the coupling is superior to the coupling achieved by an ordinary surface treating agent of the surface adsorption type.

The phase separation structure exhibited by the polymer is not particularly limited and includes, for example, a phase separation structure formed by the spinodal decomposition exhibited by a polymer blend and a micro phase separation structure exhibited by a block copolymer or a graft copolymer. The micro phase separation structure exhibited by a block copolymer or a graft copolymer is most desirable because the diameter of the pore can be controlled easily and it is possible to form a regular porous structure.

Particularly, the bi-continuous structure among the micro phase separation structure is a phase separation structure consisting of two phases continuous to each other in a three dimensional direction, and a porous body having pores continuous in a three dimensional direction can be formed by selectively removing one phase. An OBDD structure and Gyroid structure are desirable among the co-continuous structure. Also, the weight fraction in the copolymer of the polymer chain constituting the porous body should be set to fall within a range of between 30% and 70%.

It is possible to control the pore diameter of the porous body in accordance with the molecular weight of the polymer chain constituting the phase that is removed from the phase separation structure. It is also possible to control the pore diameter of the porous body by mixing a homopolymer compatible with the polymer chain. A porous body having a pore diameter not smaller than 100 nm, which is difficult to prepare by the copolymer alone, can be prepared relatively easily by using the technique of mixing a homopolymer. It should be noted, however, that, if the mixing amount of the homopolymer is unduly large, the regularity of the phase separation structure is lowered. Such being the situation, it is desirable for the mixing amount of the homopolymer to be not higher than 10% by weight based on the copolymer.

The three dimensional porous body manufactured from a co-continuous structure has a continuous pore having a relative distance relating to each of $2\sqrt{3}$ times and 4 times as large as the radius of gyration of the cross section of a micro domain constituting the three dimensional porous structure. This can be confirmed by a small angle-X-ray scattering method or a light scattering method. Incidentally, the expression "to have a relative distance" implies that, when the probability of presence of the ambient domain relative to the distance r from the center of a predetermined domain, i.e., the probability that the point at a distance r is a loaded region forming a domain, is measured, there is a distance at which the probability of presence denotes a maximal.

The method of selectively removing one phase from the micro phase separation structure is not particularly limited, and various methods can be employed for the selective removal of one phase. For example, it is possible to employ a method of chemically cutting coupling portion by using terekeric polymers, followed by etching one of the polymer chains. It is also possible to employ a method of decomposing and removing one phase by selective ozone oxidation and a removing method by an oxygen plasma or a photolytic degradation. It is also possible to selectively decompose and remove one phase by irradiation with an energy beam such as a β-ray.

The polymer materials used for preparing the porous body from the phase separation structure are not particularly limited, and an optional polymer material can be used. Specifically, the polymer materials used include, for example, a polyolefin, an acryl-series polymer, a polyether such as polyally ether, a polyester such as polyallylate, a polyamide, a polyimide and a polyether sulfone.

Where a porous body is used as a substrate for forming a wiring, it is particularly desirable to use a heat resistant polymer such as polyimide, polyamide, polyally ether, polyallylate, and polyether sulfone. It is also possible to use a crosslinked polymer prepared by crosslinking a polymer prepared by polymerizing a conjugated diene monomer and having a double bond in the side chain or the backbone chain such as a 1,2-coupling type or 1,4-coupling type polybutadiene.

A porous body consisting of polyimide can be prepared by the method described below. In the first step, a polyamic acid, which is a precursor of polyimide, is mixed with a thermally decomposable polymer such as polyethylene oxide, polypropylene oxide, or poly(methyl methacrylate). In this case, it is possible to achieve the phase separation as a block copolymer or a graft copolymer. Then, a heat treatment is applied so as to convert the polyamic acid into polyimide and, at the same time, to remove the thermally decomposable polymer by evaporation.

It is desirable to use a block copolymer or a graft copolymer in view of the regularity of the structure. It should be noted, however, that, in the case of forming pores each having a diameter not smaller than 100 nm, it is relatively difficult to synthesize a block copolymer because the molecular weight of the thermally decomposable polymer chain exceeds about 100,000. Therefore, it is desirable to introduce, for example, a coupling group to the terminal of the thermally decomposable polymer chain, followed by synthesizing a graft copolymer. It is also possible to control the pore diameter of the porous body by adding a homopolymer to a block copolymer or a graft copolymer. It should be noted, however, that, if the mixing amount of the homopolymer is unduly large, the regularity of the phase separation structure is lowered. Such being the situation, it is desirable for the mixing amount of the homopolymer to be not larger than 10% by weight relative to the copolymer. It should also be noted that, if a crosslinkable plasticizer such as bismaleimides is added, the formation of the micro phase separation structure is promoted and, at the same time, the heat resistance and the mechanical strength of the porous body are improved.

It should be noted that 1,2-coupling type polybutadiene, i.e., poly(vinylethylene) can be crosslinked in a three dimensional direction by the addition of a radical generating agent or a crosslinking agent so as to provide a cured polymer excellent in the heat resistance, the electrical properties, the humidity resistance and the mechanical characteristics. In addition, since poly(vinylethylene) is capable of a living polymerization, it is possible to obtain a block copolymer having a high molecular weight and uniform in the molecular weight distribution. As a result, in the case of using a block copolymer between poly(vinylethylene) and poly (methacrylic acid ester) that can be decomposed and removed by the irradiation with β-rays, it is possible to obtain a porous body formed of a crosslinked poly (vinylethylene) and having regularly arranged pores of a desired pore diameter. The pore diameter of the porous body can be controlled by adding a homopolymer in this case, too.

It is possible to use widely known organic peroxides such as dicumyl peroxide or azonitriles such as azobisisobutyronitrile as a radical generating agent. Particularly, it is desirable to use polyfunctional radical generating agents such as 2,2-bis(4,4-di-t-butyl peroxy cyclohexyl)propane and 3,3',4,4'-tetra(t-butyl-peroxycarbonyl)benzophenone because these polyfunctional radical generating agents also perform the function of a crosslinking agent.

The addition amount of the radical generating agent should be 0.1 to 20% by weight, preferably 1 to 5% by weight, based on the polymer chain that is to be crosslinked. If the addition of the radical generating agent is unduly small, the crosslinking density is low. If the addition amount is unduly high, however, the crosslinked body tends to become porous and the micro phase separation structure tends to be disturbed.

It is desirable to use as the crosslinking agent bismaleimides such as bis(4-maleimide phenyl)methane, bis(4-maleimide phenyl)ether, 2,2'-bis[4-(para-aminophenoxy) phenyl]propane and 2,2'-bis[4-(para-aminophenoxy)phenyl] hexafluoropropane. The addition amount should fall within a range of between 0.1 and 20% by weight, preferably between 1 and 5% by weight, based on the polymer chain to be crosslinked. If the addition amount of the crosslinking agent is unduly small, the density of the crosslinkage is low. If the addition amount is excessively large, however, the micro phase separation structure is disturbed.

If the crosslinking reaction proceeds before formation of the micro phase separation structure, the formation of the micro phase separation structure is impaired. Thus, it is desirable for the crosslinking reaction to be started after sufficient formation of the micro phase separation structure. Formation of the micro phase separation structure proceeds under temperatures not lower than the glass transition temperature of each polymer chain forming a copolymer. Thus, it is desirable for the glass transition temperature of the polymer chain to be sufficiently lower than the radical generation temperature of the radical generating agent.

An example of the most preferred composition is a composition prepared by adding 2,2-bis(4,4-di-t-butyl peroxy cyclohexyl)propane or 3,3',4,4'-tetra(t-butyl peroxy carbonyl)benzophenone to a diblock copolymer or a triblock copolymer among poly(vinylethylene) chain and poly (methyl methacrylate) chain or poly(α-methyl styrene) chain in an amount of 1 to 5% by weight based on the poly(vinylethylene) chain. Particularly, it is most desirable to use 3,3',4,4'-tetra(t-butyl peroxy carbonyl)benzophenone as the radical generating agent.

A micro phase separation structure is formed first by the heating at temperatures not lower than the glass transition temperature of each polymer chain, followed by gradually elevating the heating temperature so as to perform the heating at temperatures not lower than the thermal decomposition temperature of the radical generating agent, thereby performing crosslinking and curing. It should be noted, however, that, if the heating temperature is unduly high, the order-disorder transition temperature is exceeded before the crosslinking is performed sufficiently so as to make the system uniform by melting. In this respect, it is convenient to use 3,3'4,4'-tetra(t-butyl peroxy carbonyl)benzophenone because radicals are generated by not only the thermal decomposition but also by the ultraviolet light irradiation.

In the diblock copolymer or the triblock copolymer between the poly(vinylethylene) chain and the poly(methyl methacrylate) chain, the crosslinking reaction tends to take place before the micro phase separation structure is formed sufficiently because the poly(methyl methacrylate) has a relatively high glass transition temperature of about 105° C. However, if irradiated with β-rays, poly(methyl methacrylate) tends to be evaporated because of the thermal decomposition, with the result that poly(methyl methacrylate) can be made porous by the washing with a solvent or by the heat treatment at a relatively low temperature. Since the glass transition temperature of poly(methyl methacrylate) is close to the crosslinking-initiating temperature, it is possible to form a micro phase separation structure by forming a cast film by slowing evaporating the solvent from the solution. In this case, if the solvent is evaporated at a temperature sufficiently lower than the thermal decomposition temperature of the radical generating agent, the formation of the micro phase separation structure is not impaired by the crosslinking. However, the manufacture of such a cast film takes a relatively long time and, thus, the productivity is not high. The situation is the same in the case where poly($\alpha$-methyl styrene) is used in place of poly(methyl methacrylate).

In the case of using polymethacrylic acid esters in which an alkyl group having 3 to 6 carbon atoms is substituted or poly($\alpha$-methyl styrene) in which such an alkyl group is substituted for the phenyl group in place of poly(methyl methacrylate) or poly($\alpha$-methyl styrene), the glass transition temperature is lowered, making it possible to avoid the above-noted problem. To be more specific, a micro phase separation structure can be formed promptly by applying a heat treatment to a copolymer film (or copolymer molding) under temperatures not lower than the glass transition temperature. For example, poly(n-propyl methacrylate) and poly(n-butyl methacrylate) have low glass transition temperatures of 35° C. and 25° C., respectively. Poly($\alpha$-methyl styrene) butylated in 4-position also has a low glass transition temperature. If the number of carbon atoms forming the alkyl group is larger than 6, the glass transition temperature is further lowered. However, at the same time, the crosslinking reaction tends to take place upon irradiation with $\beta$-rays. The polymers satisfying both the low glass transition temperature and the promotion of the decomposition by irradiation with $\beta$-rays include, for example, poly(n-propyl methacrylate), poly(n-butyl methacrylate) and poly(s-butyl methacrylate). Particularly, it is most desirable to use poly (n-butyl methacrylate) and poly(s-butyl methacrylate).

Where the alkyl group is branched like 2-ethyl hexyl group, the effect of promoting the decomposition by irradiation with $\beta$-rays is unlikely to be suppressed and, thus, it is desirable to use a branched alkyl group. However, the poly(methacrylate) having a branched alkyl group is inferior in the practical use to poly(n-butyl methacrylate) and poly (s-butyl methacrylate) because it is difficult to obtain monomers of polymethacrylate having a branched alkyl group.

It is also possible to use polyisobutylene and polypropylene in addition to the polymers described above as a polymer chain satisfying both the low glass transition temperature and the effect of promoting decomposition by irradiation with $\beta$-rays.

The irradiation amount of the $\beta$-rays, which is not particularly limited in the present invention, should fall within a range of between 100 Gy and 10 MGy, preferably between 1 KGy and 1 MGy, and most preferably between 10 KGy and 200 KGy. If the irradiation amount is unduly small, it is difficult to decompose sufficiently the decomposable polymer chain. On the other hand, if the irradiation amount is excessively large, the decomposed product of the decomposable polymer chain tends to be crosslinked in a three dimensional direction so as to be cured. Further, the polymer chain, which is unlikely to be decomposed, tends to be decomposed. The accelerating voltage, which is dependent on the thickness of the molded body of the copolymer, i.e., the penetration length of the $\beta$-rays into the molded body, should desirably fall within a range of between about 20 kV and 2 MV when it comes to a thin film having a thickness of about scores of $\mu$m or less and should desirably fall within a range of between about 500 kV and 10 MV when it comes to a molded body such as a film or bulk having a thickness of at least 100 $\mu$m. Where a metal molded body is contained in the molded body, it is possible to further increase the accelerating voltage.

In the case of employing the irradiation with $\beta$-rays, 1,2-coupling type polybutadiene chain is crosslinked and, thus, it is possible to decrease the amount of the radical generating agent, or it is possible not to add at all the radical generating agent. In this case, it is not absolutely necessary to lower the glass transition temperature. Crosslinked poly (vinylethylene) exhibits excellent characteristics and, thus, it is attempted to use the crosslinked poly(vinylethylene) in a wiring board, though the crosslinked polymer is not satisfactory in the adhesivity to copper used as a wiring material. However, the difficulty can be avoided in the present invention because the wiring and the via consisting of copper is formed integral with the porous body in the present invention.

Each process of the method of the present invention for manufacturing a composite member will now be described with reference to FIGS. 1A to 1E.

<Process 1>

Process (1): In the first step, a photosensitive composition layer 2 containing a compound forming an ion-exchange group or allowing the ion-exchange group to disappear upon exposure to light is formed on an insulator 1, as shown in FIG. 1A. In FIGS. 1A to 1E, exemplified is a use of a photosensitive composition containing a compound forming an ion-exchange group upon exposure to light.

Where a conductive portion is formed to extend in the planar direction and the thickness direction of the insulator 1, the conductive portion can be formed easily and with a high accuracy by using the insulator 1 that is porous.

The photosensitive composition used in the method of the present invention for forming a composite member contains a compound forming an ion-exchange group upon irradiation with light or a compound allowing an ion-exchange group to disappear upon irradiation with light. It should be noted in this connection that it is possible for the compound forming an ion-exchange group to be a compound forming an ion-exchange group by multi-stage reactions caused by a chemical reaction started upon irradiation with light. In such a compound, a chemical reaction is started upon irradiation with light so as to form some precursor of an ion-exchange group and, then, the precursor performs an additional chemical reaction so as to form an ion-exchange group.

The compound forming an ion-exchange group upon irradiation with light includes (i) a compound generating a functional group capable of an ion-exchange upon irradiation with light.

On the other hand, the compound allowing an ion-exchange group to disappear upon irradiation with light includes (ii) a compound having a functional group capable of an ion exchange before irradiation with light, and generating a functional group having a hydrophobic nature so as to be unlikely to be dissolved in water or unlikely to be swollen after irradiation with light.

The functional group capable of ion exchange, which is included in each of compounds (i) and (ii) noted above, includes hydrophilic functional groups such as —COOX group, —SO$_3$X group, —PO$_3$X$_2$ group (X being selected from a hydrogen atom, an alkali metal, an alkaline earth metal, a typical metal belonging to Groups 1 and 2 of the Periodic Table, and an ammonium group), and —NH$_2$OH.

Particularly, in compounds (i) and (ii), it is desirable for the functional group capable of ion exchange to be a cation-exchange group because the cation-exchange group easily performs an ion exchange with a metal ion. It is particularly desirable for the cation-exchange group to be an acidic group such as a —COOX group, a —SO$_3$X group or a —PO$_3$X$_2$ group (X being selected from a hydrogen atom, an alkali metal, an alkaline earth metal, a typical metal belonging to Groups 1 and 2 of the Periodic Table, and an ammonium group). If such an acidic group is contained, it is possible to obtain a stable adsorption with a metal or fine metal particles formed by reduction after the subsequent metal ion exchange step.

Among the cation-exchange groups described above, more desirable is a cation-exchange group having a pKa value not larger than 7.2, said pKa value being obtained from the ion dissociation characteristics within water. If the pKa value exceeds 7.2, the coupling per unit area is small in the subsequent step (step (3)) of coupling the metal ion or metal, with the result that a sufficient conductivity as desired may fail to be obtained in the conductive portion formed later.

In each of the first and second aspects of the present invention, a compound forming an ion-exchange group or allowing an ion-exchange group to disappear upon irradiation with light having a wavelength not shorter than 280 nm is used as a compound forming an ion-exchange group or allowing an ion-exchange group to disappear upon irradiation with light.

Specific compounds forming an ion-exchange group or allowing an ion-exchange group to disappear upon irradiation with light having a wavelength not shorter than 280 nm include, for example, a naphthoquinone diazide derivative, an o-nitrobenzyl ester derivative, a p-nitrobenzyl ester sulfonate derivative and naphthyl or phthalimide trifluoro sulfonate derivative.

Particularly, in the case of using a naphthoquinone diazide derivative, a fine patterning can be achieved sufficiently in a short time with a light having a wavelength not shorter than 280 nm, which has a low energy. It should also be noted that a naphthoquinone diazide derivative brings about a light bleaching in the exposure step so as to be made transparent in the wavelength region not shorter than about 300 nm. As a result, the light exposure can be applied to reach a deep region in the thickness direction of the porous sheet. Clearly, a naphthoquinone diazide derivative is highly adapted for use in the case of applying the light exposure in a manner to extend through the porous sheet in the thickness direction of the porous sheet.

The light exposure reaction in the case of using, for example, a naphthoquinone diazide derivative as a compound forming an ion-exchange group is shown in chemical formula (1) given below:

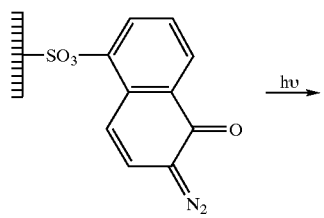

(1)

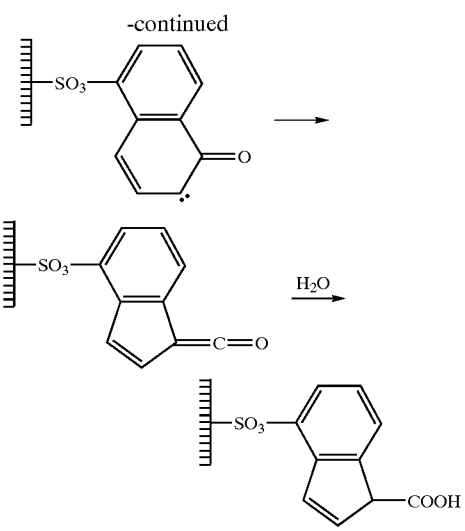

As shown in chemical formula (1), naphthoquinone diazide formed in an insulator generates —COOH group in the light exposure step and in the subsequent step in the presence of water.

Incidentally, the photosensitive composition layer is exposed to an aqueous solution containing a metal ion or to an alkaline or acidic aqueous solution in the subsequent step. Since the photosensitive composition ionized by the ion exchange reaction is easily dissolved in an aqueous solution, the photosensitive composition layer tends to be peeled easily off the insulator used as a substrate. Such being the situation, in order to prevent the photosensitive composition layer from being peeled off the substrate, it is desirable for the group generating an ion-exchange group to be supported by or coupled with a high molecular weight compound such as a polymer. It is most desirable for the group generating an ion-exchange group to be chemically bonded by a covalence bond to a high molecular weight compound.

In this case, it is desirable for the molecular weight of the polymer or the high molecular weight compound to be at least 1,000, more desirably at least 2,000. In the case of using a polymer having a molecular weight smaller than 1,000, the coating properties relative to the insulator forming the substrate are rendered poor, making it difficult to achieve a uniform coating. Also, deterioration tends to be brought about by the exposure to the alkaline or acidic aqueous solution in, for example, the plating step.

If it is simply intended to prevent the peeling from the substrate, it suffices to form on the surface of the substrate a monomolecular film of a low molecular weight compound having a group capable of a chemical coupling with the substrate and an ion-exchange group. For example, Japanese Patent Disclosure No. 6-202343 discloses a method of forming a monomolecular film of a silane coupling agent having a naphthoquinone diazide group, which forms an ion-exchange group when sensitized to light, on the surface of a glass substrate.

However, it has been clarified by the research conducted by the present inventors that, in the case of a monomolecular film, the adsorption amount of the plating nuclei is small, resulting in failure to achieve a sufficient plating. By using a polymer-like photosensitive composition, it is possible to cover the surface of the substrate with the composition layer having a reasonable thickness. It follows that, since a sufficient amount of plating nuclei are adsorbed, it is possible to achieve a satisfactory plating.

In view of the situation described above, the compound used in the present invention for forming an ion-exchange group upon irradiation with light having a wavelength not shorter than 280 nm includes, for example, 1,2-naphthoquinone diazide sulfonyl-substituted phenolic resin derivative and 1,2-naphthoquinone diazide sulfonyl-substituted polystyrene derivative.

Another example of a compound forming an ion-exchange group upon irradiation with light having a wavelength not shorter than 280 nm is a compound having a protective group introduced into an ion-exchange group such as a carboxyl group included in the structure of a polymer. In the case of using the particular compound, a photo acid generating agent, which generates an acid upon irradiation with light having a wavelength not shorter than 280 nm, is added to the photosensitive composition. An acid is generated from the photo acid generating agent by the light exposure in the subsequent step, and the protective group is decomposed by the acid thus generated so as to form an ion-exchange group. Incidentally, the polymer referred to above includes, for example, phenolic resins such as phenol-novolak resin, xylenol-novolak resin, vinyl phenol resin, cresol novolak resin, and polymers having a carboxyl group such as a polyamic acid, a polyacrylic acid, and a polymethacrylic acid.

The protective group of the phenolic resins includes, for example, substituents of tert-butyl ester derivatives such as tert-butoxy carbonyl methyl group and tert-butoxy carbonyl ethyl group.

On the other hand, the protective group of the carboxyl group included in polyamic acid or polyacrylic acid includes, for example, methyl group, ethyl group, n-propyl group, i-propyl group, n-butyl group, sec-butyl group, tert-butyl group, alkoxy groups such as benzyl alkoxy group, 2-acetoxy ethyl group, 2-methoxy ethyl group, methoxy methyl group, 2-ethoxy ethyl group, and 3-methoxy-1-propyl group, and alkyl silyl groups such as trimethyl silyl group, triethyl silyl group and triphenyl silyl group.

Also, o-nitrobenzyl ester group can be used as a protective group forming an ion-exchange group such as a carboxyl group upon irradiation with light without using a photo acid generating agent.

The photo acid generating agent suitable for de-protection of the protective group includes, for example, salts such as onium salt, diazonium salt, phosphonium salt and iodonium salt, in which $CF_3SO_3^-$, p—$CH_3PhSO_3^-$, p—$NO_2PhSO_3^-$, etc. provides a counter anion, organic halogen compounds and o-quinone diazide sulfonic acid ester.

By using a composition generating an ion-exchange group by chemical amplification reaction, it is possible to improve sensitivity to the light. The composition is useful for forming fine patterns where light transmission in the film thickness direction is required such as forming three dimensional pattern in a porous body.

On the other hand, as a compound generating a functional group allowing an ion-exchange group to disappear upon irradiation with light having a wavelength not shorter than 280 nm, i.e., a functional group exhibiting an ion exchange capability before exposure to light and exhibiting a hydrophobic nature after exposure to light that the compound is unlikely to be dissolved in water and to be swollen, it is possible to use a compound having an acidic group such as —COOX group, —$SO_3X$ group or —$PO_3X_2$ group, where X represents a hydrogen atom, an alkali metal, an alkaline earth metal, a typical metal belonging to Group I or II of the Periodic Table, or an ammonium group, in the skeleton of the composition and allowing the ion exchange capability to disappear upon irradiation with light.

The compound generating a functional group exhibiting an ion exchange capability before exposure to light and exhibiting a hydrophobic nature after exposure to light that the compound is unlikely to be dissolved in water and to be swollen includes a compound having a carboxyl group that is decomposed by the decarboxylation reaction upon irradiation with light in the presence of a basic substance. In this case, a photo acid generating agent and a basic compound are added to the photosensitive composition together with the compound having a carboxyl group. In the particular composition, the acid generated by the light exposure neutralizes the basic compound involved in the decarboxylation reaction. As a result, the ion exchange capability in the light exposed portion is caused to disappear by the mechanism that the carboxyl group remains as it is in the light exposed portion and the decarboxylation reaction proceeds in the unexposed portion.

An optional compound can be selected as the compound having a carboxyl group that can be decomposed by the decarboxylation reaction, though it is desirable to use a compound that permits the decarboxylation reaction to proceed in the presence of a basic compound. Such a compound includes a compound having an electron attractive group or an unsaturated bond in α- or β-position of the carboxyl group. It is desirable for the electron attractive group to be a carboxyl group, a cyano group, a nitro group, an aryl group, a carbonyl group or a halogen atom.

The specific compounds having a carboxyl group include, for example, α-cyano carboxylic acid derivative, α-nitro carboxylic acid derivative, α-phenyl carboxylic acid derivative, and β, γ-olefin carboxylic acid derivatives.

The photo acid generating agent described previously can be added to the photosensitive composition. It is particularly desirable for the photo acid generating agent to generate an acid upon irradiation with light having a wavelength of 280 nm or more.

An optional basic compound can be added to the photosensitive composition as far as the compound can be neutralized by the acid released from the photo acid generating agent and can perform the function of a catalyst for the decarboxylation reaction of the compound having a carboxyl group. The basic compound may be either an organic compound or an inorganic compound, and it is desirable for the basic compound to be a nitrogen-containing compound. To be more specific, the desirable basic compound includes, for example, ammonia, primary amines, secondary amines and tertiary amines. These basic compounds should be contained in the photosensitive composition in an amount of 0.1 to 30% by weight, preferably 0.5 to 15% by weight. Where the amount of the basic compound is smaller than 0.1% by weight, the decarboxylation reaction does not proceed sufficiently. On the other hand, if the amount of the basic compound exceeds 30% by weight, deterioration of the compound having a carboxyl group, which remains in the unexposed portion, tends to be promoted.

The photosensitive composition layer is exposed in the subsequent step to an aqueous solution containing metal ions or to an alkaline or acidic aqueous solution. Therefore, in order to prevent the photosensitive composition layer from being dissolved in the solution, it is desirable for the group that causes a reaction to allow the ion-exchange group to disappear to be supported by or bonded to a polymer or a high molecular weight compound. As already described, it is most desirable for the group causing the reaction to allow the ion-exchange group to disappear to be chemically bonded to a polymer or a high molecular weight compound having a molecular weight of at least 1,000.

In the third aspect of the present invention, at least one derivative selected from the group consisting of an onium salt derivative, a sulfonium ester derivative, a carboxylic acid derivative and a naphthoquinone diazide derivative is used as a compound forming an ion-exchange group upon exposure to light.

The onium salt derivative used in the present invention includes, for example, a diazonium salt, a phosphonium salt, iodonium salt, and sulfonium salt, in which $CF_3SO_3^-$, p—$CH_3PhSO_3^-$, p—$NO_2PhSO_3^-$, etc. provides a counter anion. To be more specific, the onium salt used in the present invention includes, for example, diphenyl iodonium, 4,4'-dibutylphenyl iodonium, triphenyl sulfonium, trifluoro acetate series derivative such as naphthyl sulfonium, trifluoro methane sulfonate derivative, and toluene sulfonate derivative.

The sulfonium ester derivative used in the present invention includes, for example, benzoin tosylate series derivative, o-nitrobenzyl tosylate series derivative, p-nitrobenzyl ester series derivative of aryl sulfonic acid, and p-nitrobenzyl-9,10-diethoxy anthracene-2-sulfonate series derivative.

The carboxylic acid derivative used in the present invention includes, for example, polymers of the phenolic resin, the polyamic acid and the polyacrylic acid described above, in which the hydroxyl group or the carboxyl group is protected, said polymers including phenolic resin derivatives such as phenol novolak resin derivatives, xylenol novolak resin derivatives, vinyl phenol resin derivatives, the cresol novolak resin derivatives, and polymer derivatives having a carboxyl group such as polyamic acid derivatives, the polyacrylic acid derivatives and polymethacrylic acid derivatives.

The protective group of the phenolic resin derivatives include, for example, the substituent groups comprising tert-butyl ester derivatives such as tert-butoxy carbonyl methyl group and tert-butoxy carbonyl ethyl group.

On the other hand, the protective group of the carboxyl group included in polyamic acid or polyacrylic acid includes, for example, methyl group, ethyl group, n-propyl group, i-propyl group, n-butyl group, sec-butyl group, tert-butyl group, alkoxy groups such as benzyl alkoxy group, 2-acetoxy ethyl group, 2-methoxy ethyl group, methoxy methyl group, 2-ethoxy ethyl group, and 3-methoxy-1-propyl group, and alkyl silyl groups such as trimethyl silyl group, triethyl silyl group and triphenyl silyl group. These protective groups act on a suitable photo acid generating agent so as to generate a carboxyl group.

Further, the naphthoquinone diazide derivative used in the present invention includes, for example, naphthoquinone diazide-4-sulfonic acid derivative, naphthoquinone diazide-5-sulfonic acid derivative, and naphthoquinone diazide sulfonyl halide series derivative.

The photosensitive composition layer containing the compounds described above is exposed in the subsequent step to an aqueous solution containing metal ions or to an alkaline or acidic aqueous solution. Therefore, in order to prevent the photosensitive composition layer from being dissolved in the aqueous solution, it is desirable for the group carrying out a reaction to form an ion-exchange group to be supported by or bonded to the polymer or the high molecular weight compound. As already pointed out, it is most desirable for the group carrying out a reaction to from the ion-exchange group to be chemically bonded to a polymer or a high molecular weight compound having a molecular weight of at least 1,000.

Under the circumstances, it is desirable to form the ion-exchange group by de-protection using 1,2-naphthoquinone diazide sulfonyl-substituted phenolic resin derivative, 1,2-naphthoquinone diazide sulfonyl-substituted polystyrene derivative or a photo acid generating agent of the protective group of the polymer functional group.

According to the fourth aspect of the present invention, used is a photosensitive composition containing a compound generating a functional group allowing an ion-exchange group to disappear upon irradiation with light, i.e., a functional group exhibiting an ion exchange capability before exposure to light and exhibiting a hydrophobic nature after exposure to light that the compound is unlikely to be dissolved in water and to be swollen. These compounds have ion-exchange group on the skeleton thereof and the ion exchange capability is disappeared upon irradiation with light. The ion-exchange group has an acidic group such as —COOX group, —$SO_3X$ group or —$PO_3X_2$ group, where X represents a hydrogen atom, an alkali metal, an alkaline earth metal, a typical metal belonging to Group I or II of the Periodic Table, or an ammonium group.

The compound generating a functional group exhibiting an ion exchange capability before exposure to light and exhibiting a hydrophobic nature after exposure to light that the compound is unlikely to be dissolved in water and to be swollen includes a compound having a carboxyl group that is decomposed by the decarboxylation. In this case, a photo acid generating agent and a basic compound are added to the photosensitive composition together with the compound having a carboxyl group. In the particular composition, the acid generated by the light exposure neutralizes the basic compound involved in the decarboxylation reaction. As a result, the ion exchange capability in the light exposed portion is caused to disappear by the mechanism that the carboxyl group remains as it is in the light exposed portion and the decarboxylation reaction proceeds in the unexposed portion.

An optional compound can be selected as the compound having a carboxyl group that can be decomposed by the decarboxylation reaction, though it is desirable to use a compound that permits the decarboxylation reaction to proceed in the presence of a basic compound. Such a compound includes a compound having an electron attractive group or an unsaturated bond in $\alpha$- or $\beta$-position of the carboxyl group. It is desirable for the electron attractive group to be a carboxyl group, a cyano group, a nitro group, an aryl group, a carbonyl group or a halogen atom.

The specific compounds having a carboxyl group include, for example, $\alpha$-cyano carboxylic acid derivative, $\alpha$-nitro carboxylic acid derivative, $\alpha$-phenyl carboxylic acid derivative, and $\beta$, $\gamma$-olefin carboxylic acid derivatives.

The photo acid generating agent described previously can be added to the photosensitive composition. It is particularly desirable for the photo acid generating agent to generate an acid upon irradiation with light having a wavelength of 280 nm or more.

An optional basic compound can be added to the photosensitive composition as far as the compound can be neutralized by the acid released from the photo acid generating agent and can perform the function of a catalyst for the decarboxylation reaction of the compound having a carboxyl group. The basic compound may be either an organic compound or an inorganic compound, and it is desirable for the basic compound to be a nitrogen-containing compound. To be more specific, the desirable basic compound includes, for example, ammonia, primary amines, secondary amines and tertiary amines. These basic compounds should be contained in the photosensitive composition in an amount of 0.1 to 30% by weight, preferably 0.5 to 15% by weight.

Where the amount of the basic compound is smaller than 0.1% by weight, the decarboxylation reaction does not proceed sufficiently. On the other hand, if the amount of the basic compound exceeds 30% by weight, deterioration of the compound having a carboxyl group, which remains in the unexposed portion, tends to be promoted.

The photosensitive composition layer is exposed in the subsequent step to an aqueous solution containing metal ions or to an alkaline or acidic aqueous solution. Therefore, in order to prevent the photosensitive composition layer from being dissolved in the solution, it is desirable for the group that causes a reaction to allow the ion-exchange group to disappear to be supported by or bonded to a polymer or a high molecular weight compound. As already described, it is most desirable for the group causing the reaction to allow the ion-exchange group to disappear to be chemically bonded to a polymer or a high molecular weight compound having a molecular weight of at least 1,000.

As described above, according to the method of the present invention, light exposure is selectively applied in a pattern to the photosensitive composition layer so as to selectively arrange the ion-exchange groups in the exposed portion or unexposed portion of the photosensitive composition layer. It should be noted that, although the region in which the ion-exchange groups are arranged is hydrophilic, the region in which the ion-exchange groups are not arranged tends to be rendered hydrophobic in many cases. However, in the present invention, it is desirable for the region in which the ion-exchange groups are not arranged to be also hydrophilic so as to have a wettability with water. Where the hydrophobic nature of the region in which the ion-exchange groups are not arranged is unduly strong, the contact between the plating solution and the substrate is rendered insufficient in the plating step described herein later under the heading "<step (5)>", with the result that the air bubbles are likely to be attached to the substrate. If the air bubbles are attached to the substrate, that portion of the substrate to which the air bubbles are attached is not plated, resulting in failure to form a satisfactory metal pattern. Particularly, in the case of using a porous body as a substrate, the plating solution is unlikely to permeate into the inner region of the porous body. It follows that, if the hydrophobic nature of the region in which the ion-exchange groups are not arranged is unduly strong, it is difficult to achieve plating in the inner region of the porous body.

Japanese Patent Disclosure No. 6-202343 discloses a method of forming a metal pattern, in which a pattern consisting of a hydrophilic region and a hydrophobic region is formed first in the substrate, followed by selectively applying a plating to the hydrophilic region so as to form a desired metal pattern. In this prior art, the hydrophobic region is selectively fluorinated so as to increase the hydrophobic nature of the region, thereby improving the selectivity of the plating. The fluorination permits increasing the difference in the wettability with water between the hydrophilic region and the hydrophobic region. In this prior art, the plating solution is selectively brought into contact with the hydrophilic region so as to improve the selectivity of the plating.

However, in the prior art described above, the air bubbles are likely to be attached to the hydrophobic region as described previously, resulting in failure to achieve a satisfactory plating. Further, since the plating solution is unlikely to permeate into the inner region of the porous body, it is very difficult to achieve the plating in the inner region of the porous body.

On the other hand, it is unnecessary to form the hydrophilic region and the hydrophobic region in the method of the present invention. By contraries, the substrate is brought into contact sufficiently with the plating solution in the present invention by making hydrophilic the entire surface of the insulator used as a substrate so as to achieve a satisfactory plating.

The wettability with water can be measured easily by the contact angle when a water droplet is dripped onto a flat surface. In the present invention, it is desirable for the contact angle to be not larger than 60°, preferably not larger than 40° even in the region in which the ion-exchange groups are not arranged.

It is possible for the photosensitive composition used in the manufacturing method of the present invention to contain additives depending on the purposes in addition to a compound forming an ion-exchange group upon exposure to light. For example, it is possible for the photosensitive composition to contain a photosensitizer for improving the resolution and the permeability in the thickness direction of the substrate. The photosensitizer used in the present invention is not particularly limited, as far as it is possible to photosensitive the compound forming an ion-exchange group upon exposure to light. It is possible to select appropriately the photosensitizer depending on the kind of the compound and the light source used.

Specific examples of the photosensitizer used in the present invention include, for example, aromatic hydrocarbon and its derivatives, benzophenone and its derivatives, o-benzoyl benzoic acid ester and its derivative, acetophenone and its derivative, benzoin and benzoin ether and their derivatives, xanthone and its derivatives, thioxanthone and its derivative, a disulfide compound, quinone-series compound, a halogenated hydrocarbon-containing compound, amines, xanthene colorants such as eosin B (C.I. No. 45400), eosin J (C.I. No. 45380), cyanosin (C.I. No. 45410), bengalrose, erythrosin (C.I. No. 45430), 2,3,7-trihydroxy-9-phenyl xanthene-6-one, and Rhodamine 6G, thiazine colorants such as thionin (C.I. No. 52000), azule A (C.I. No. 52005), and azule C (C.I. No. 52002), pyronine colorants such as pyronine B (C.I. No. 45005), pyronine GY (C.I. No. 45005), and cumarin colorants such as 3-acetyl cumarin, 3-acetyl-7-diethylamino cumarin.

The mixing amount of the photosensitizer should generally be 0.001 to 10% by weight, preferably 0.01 to 5% by weight, based on the amount of the compound forming an ion-exchange group upon exposure to light.

Where a naphthoquinone diazide derivative is used as the compound forming an ion-exchange group upon exposure to light, it is desirable to add a carbodiimide derivative or an amine derivative as a crosslinking agent. It is possible to impart a heat resistance to the obtained insulator by applying a heat treatment to the photosensitive composition after formation of the conductive portion so as to cure the photosensitive composition. The mixing amount of the crosslinking agent is determined appropriately on the basis of, for example, the amounts of the mutual functional groups reacting each other.

It is desirable to use a photosensitive composition containing a naphthoquinone diazide derivative and a polycarbodiimide derivative as the photosensitive composition used in the method of the present invention for forming a composite member. In the case of using such a photosensitive composition, the ion-exchange group generated from the naphthoquinone diazide derivative and the carbodiimide derivative are caused to be crosslinked each other by the heat treatment after formation of the conductive portion. As a result, the contact properties between the conductive portion and the insulator are improved, making it possible to obtain a composite member having a high heat resistance and including a conductive portion having a fine pattern.

In the photosensitive composition described above, the hydrophilic ion-exchange groups are selectively formed in the light exposed portion so as to provide a difference in solubility between the light exposed portion and the unexposed portion of the photosensitive composition layer. It is possible to form easily a pattern of the photosensitive composition by utilizing the difference in solubility noted above.

Incidentally, it is possible to use the particular photosensitive composition can be used as a light shielding photosensitive resin composition adapted for the manufacture of an optical color filter used in, for example, an interlayer insulating film for a built-up substrate, a color liquid crystal display device, an electroluminescence display, a color fluorescent display device, a plasma display panel, an OA sensor, and a solid image pickup element. The particular photosensitive composition exhibits prominent characteristics in respect of the resistance to chemicals, resistance to water, heat resistance and a high adhesion properties to a substrate and, thus, is a useful photosensitive composition.

1,2-naphthoquinone diazide sulfonyl-substituted phenolic resin, 1,2-naphthoquinone diazide sulfonyl-substituted polystyrene resin, etc. constitute the particularly desirable naphthoquinone diazide derivative contained in the photosensitive composition described above. Where the photosensitive composition contains the particular naphthoquinone diazide derivative noted above, the film-forming capability of the composition can be improved so as to make it possible to form a thin film. Particularly, where the photosensitive composition contains 1,2-naphthoquinone diazide sulfonyl-substituted phenolic resin, the phenolic hydroxyl group and the polycarbodiimide derivative are mutually crosslinked each other so as to be cured, with the result that the photosensitive composition is most excellent in the heat resistance.

It is desirable for the carbodiimide derivative contained in the photosensitive composition described above to be a compound represented by general formula (I) given below:

$$\text{-[N=C=N-R1]}_n\text{-} \qquad (I)$$

where R1 represents an organic group having 1 to 20 carbon atoms, which is represented by a methylene group, an ethylene group, a propylene group, an isoprene group, and a butadiene group.

Where the polycarbodiimide derivative has an aliphatic skeleton as shown in general formula (I) given above, the composition can be set at a low viscosity. Therefore, in the case of the coating using a solvent such as a spin coating method and a dip coating method, the polycarbodiimide derivative of the particular structure is used desirably in order to form a thin film of the organic photosensitive composition.

In the photosensitive composition described above, the amounts of the naphthoquinone diazide derivative and the polycarbodiimide derivative are determined in view of the equivalents of the functional groups mutually reacting each other, and it is desirable for the naphthoquinone diazide derivative to be contained such that the amount of the reactive group is 0.01 mol to 1 mol relative to 1 mol of the carbodiimide group. If the amount of the reactive group is less than 0.01 mol, the reactivity is poor, making it difficult to obtain a desired heat resistance. Also, if the amount of the reactive group exceeds 1 mol, the storage stability under room temperature is lowered, with the result that the step of the present invention tends to be impaired. If the amount of the reactive group is controlled to fall within the range noted above, it is possible to set the reaction temperature at about 100° C., and it is desirable to carry out the reaction after completion of this process.

It is possible for the photosensitive composition used in the method of the present invention for forming a composite member to be formed into a sheet by molding the mixture of the constituting components or to be formed into a solution by dissolving the mixture of the constituting components in a suitable solvent.

In order to form the photosensitive composition layer on an insulator, it is possible to attach a photosensitive composition in the form of a sheet to an insulator so as to form the photosensitive composition layer on the surface of the insulator. Alternatively, it is possible to coat the surface of an insulator with a photosensitive composition in the form of a solution so as to form a photosensitive composition layer on the surface of the insulator. In view of the durability of the composite member after formation of the conductive portion, it is desirable to coat the surface of an insulator with a solution of the photosensitive composition so as to form the photosensitive composition layer.

Also, where a conductive portion extending in a three dimensional direction is formed by using a porous insulator, the porous insulator is impregnated with a solution of a photosensitive composition such that inner region of the porous insulator is impregnated with the solution so as to form a photosensitive composition layer. Alternatively, the surface of the porous insulator is coated with a solution of the photosensitive composition so as to form a photosensitive composition layer extending from the surface into the inner region of the porous insulator.

It is possible to employ as the coating method any of a dipping method, a spin coating method, a spraying method, a vacuum vapor deposition method and a laminating method.

In the method of the present invention for manufacturing a composite member, it is desirable in view of the improvement of the productivity to use an insulator having a photosensitive composition layer formed thereon in advance.

The insulator having a photosensitive composition layer formed thereon in advance includes a porous insulator having the inner surface of the pore of the porous insulator covered with a photosensitive composition containing a naphthoquinone diazide derivative. By using a porous insulator having the inner surface of the pore of the porous insulator covered with a photosensitive composition containing a naphthoquinone diazide derivative, it is possible to form a patterned conductive portion having a high accuracy in a three dimensional pattern.

<Step (2)>

The photosensitive composition layer 2 formed on the insulator 1 in step (1) described above is selectively exposed to light to form a desired conductive pattern as shown in FIG. 1B, with the result that ion-exchange groups are selectively formed in or caused to disappear from the light exposed portions 4 of the photosensitive composition layer 2.

In the example shown in FIG. 1B, the photosensitive composition layer 2 is selectively exposed to light through a mask 3 having a conductive pattern formed therein. However, the present invention is not limited to the particular process. Alternatively, it is also possible to generate the ion-exchange groups in or to cause the ion-exchange groups to disappear from the portion other than the conductive pattern portion by using a mask having a negative image of the conductive pattern formed therein.

In performing the light exposure, it is not absolutely necessary to use a mask. For example, it is possible to depict a pattern to conform with the conductive pattern by using, for example, a laser beam for the purpose of the light exposure. It is also possible to perform the light exposure to form a periodic pattern by using a periodic light intensity pattern such as an interference pattern produced by the interference of light beams.

Further, the light exposure pattern is not limited to a two dimensional pattern. It is possible to perform the light exposure in a manner to form a three dimensional pattern. For performing the light exposure in a manner to form a three dimensional pattern, it is possible to employ various known three dimensional light exposure methods. For example, it is possible to collect the light for the light exposure by using a lens and to scan the spot of the collected light in a three dimensional direction so as to depict a pattern.

In each of the first and second aspects of the present invention, the photosensitive composition layer is irradiated with light having a wavelength not shorter than 280 nm. In order to suppress the deterioration of the insulator caused by the light exposure to a low level, it is desirable for the wavelength of the light used for the light exposure to be not shorter than 300 nm, preferably not shorter than 350 nm.

Where the porous body has an aromatic compound structure, e.g., where the light exposure is applied to the inner region of the porous body in the thickness direction of the porous body, it is important to use a light beam having a long wavelength for the light exposure. Where the porous body is formed of, for example, an aromatic polyimide, the absorption edge of the polyimide absorption is not shorter than 450 nm in many cases. In such a case, it is desirable to perform the selective light exposure to form a pattern with a light beam having a wavelength not shorter than 500 nm.

In each of the third and fourth aspects of the present invention, the wavelength of the light beam used for the light exposure need not be considered in particular.

The light source for the light exposure performed in step (2), which emits light beams having a desired wavelength, can be selected appropriately from among an ultraviolet light source and a visible light source as well as from β-rays (electron beam) and X-rays. The ultraviolet light source and the visible light source can be selected from the continuous spectrum light source such as a hydrogen discharge tube, a rare gas discharge tube, a tungsten lamp or a halogen lamp and the discontinuous spectrum light source such as various lasers or a mercury lamp.

In order to increase the coupling amount of the metal ions in the subsequent step (3) with the ion-exchange groups of the photosensitive composition layer, it is desirable to neutralize the ion-exchange groups or to swell the region in which the ion-exchange groups are formed in step (2). For this purpose, the insulator is brought into contact with an acidic or alkaline solution by means of blowing or dipping. Particularly, it is desirable to prepare an alkaline solution by dissolving in water a hydroxide such as lithium hydroxide, potassium hydroxide, or sodium hydroxide, an alkali metal salt such as lithium carbonate, potassium carbonate, or a sodium carbonate, a metal alkoxide such as sodium methoxide or potassium ethoxide, or sodium borohydride. The insulator is dipped in the alkaline solution thus prepared. The aqueous solution thus prepared can be used singly or in the form a mixture of at least two kinds of these aqueous solutions.

<Step (3)>

In the next step, metal ions or metal fine particles are selectively coupled with the ion-exchange groups thus formed so as to form a conductive portion as shown in FIG. 1C. In the example shown in FIG. 1C, the light exposed portion 4 forms a conductive portion.

The ion-exchange groups formed in the light exposed portion perform an exchange reaction with metal ions. An example of the exchange reaction carried out between the ion-exchange group and the metal ion is shown in chemical formula (2) given below:

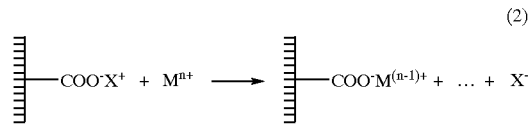

(2)

where X represents a hydrogen atom, an alkali metal, an alkaline earth metal, a typical metal belonging to Groups I and II of the Periodic Table, or an ammonium group, and M represents a metal element.

The exchange reaction between the ion-exchange group and the metal ion can be performed easily by simply dipping the insulator after the selective light exposure in a desired pattern in an aqueous solution of, for example, a metal salt.

The metal element used as a metal ion includes, for example, copper, silver, palladium, nickel, cobalt, tin, titanium, lead, platinum, gold, chromium, molybdenum, iron, iridium, tungsten, and rhodium.

These metal elements are contained in the aqueous solution in the form of a metal salt such as a sulfate, acetate, nitrate, chloride and a carbonate. Copper sulfate is particularly desirable. It is desirable to add the metal salt such that the metal ion concentration in the solution falls within a range of between 0.001M and 10M, preferably between 0.01M and 1M. Incidentally, it is possible to use water or an organic solvent such as methanol or isopropanol as the solvent in which the metal salt is dissolved.

It is desirable for the pH value of the solution containing the metal salt to be not larger than 7, preferably not larger than 6.5. In the present invention, it is desirable to use an ion-exchange group having a pKa value not larger than 7.2, said pKa value being determined from the ion dissociation constant within water. In this case, the ion exchange amount remains substantially constant as the pH value of the aqueous solution containing the metal salt approaches 7.

Also, if the pH value of the solution containing the metal salt exceeds 7, the metal ion is adsorbed on the polar groups other than the ion-exchange group, i.e., the polar groups such as the phenolic hydroxyl group and the silanol group, resulting in failure to obtain a good pattern. For example, where a glass plate is coated with a photosensitizer by means of, for example, a spin coating method, the hydroxyl group is exposed to the back surface of the glass plate that is not coated with the photosensitizer. Where the substrate is dipped in an aqueous solution containing the metal salt and having a pH value exceeding 7, the metal ion is adsorbed on the hydroxyl group. As a result, metallization takes place in the subsequent step and, thus, the back surface that is not coated with the photosensitizer is plated. Such being the situation, it is desirable for the solution containing the metal salt to have the metal salt concentration and the pH value falling within the ranges noted above.

In the present invention, it is possible to use a solution having metal fine particles dispersed therein. The ion-exchange groups and the colloidal metal fine particles are selectively coupled with each other by an electrostatic mutual function. It follows that the coupling between the ion-exchange group and the metal fine particle can be achieved easily by simply dipping the insulator in the solution having the metal fine particles dispersed therein.

For example, the insulator is dipped in a palladium-tin colloid prepared by mixing palladium chloride and tin chloride in a hydrochloric acidic aqueous solution and used as a catalyst for an electroless plating or in a solution prepared by dispersing a halide, oxide or acetylated complex of palladium. As a result, the coupling of the metal fine particles can be selectively achieved easily on the ion-exchange group.

As described above, a composite member can be obtained by forming a conductive portion in the insulator by the method of the present invention. In order to further improve the conductivity of the conductive portion of the composite member, it is desirable to carry out any one or both of step (4) and step (5) described below.

<Step (4)>

In order to further improve the conductivity of the conductive portion 4 formed by the ion exchange, the metal ion coupled with the ion-exchange group is brought into contact with a reducing agent so as to reduce the metal ion into an elemental metal.

An example of a metallizing reaction of the metal ion is shown in chemical formula (3) given below:

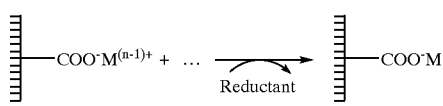

(3)

The reducing agent used, which is not particularly limited in the present invention, includes, for example, dimethyl amine borane, trimethyl amine borane, hydrazine, formalin, sodium borohydride, and hypophosphite such as sodium hypophosphite. The conductive portion 4 can be metallized by dipping the insulator in a solution containing such a reducing agent.

<Step (5)>

In order to improve the conductivity of the conductive portion 4, the electroless plating 5 is applied as shown in FIG. 1E. As a result, the pore of the conductive portion 4 can be filled to some extent with a metal.

It is most desirable to use copper as a metal because copper has a low electrical resistivity and is relatively unlikely to be corroded. To be more specific, copper is brought into contact with the electroless plating solution with the conductive portion formed in the preceding step used as a catalyst nucleus.

The electroless plating solution can be provided by a solution containing metal ions of, for example, copper, silver, palladium, nickel, cobalt, platinum, gold and rhodium.

Contained in the electroless plating solution are a reducing agent such as formaldehyde, hydrazine, sodium hypophosphite, sodium borohydride, ascorbic acid, or glyoxalic acid, and a complexing agent or a precipitation control agent such as sodium acetate, EDTA, tartaric acid, malic acid, citric acid or glycine, in addition to the aqueous solution of a metal salt described above. Many of these reducing agent, the complexing agent and the precipitation control agent are easily available on the market. It suffices to keep the porous insulator having the conductive portion formed therein dipped in the electroless plating solution until the conductive film is formed in a desired thickness by the electroless plating or until the loading of the electroless plating solution into the inner region of the porous insulator is finished.

Incidentally, in the case of using a porous body as the insulator, it is desirable to carry out further step (6) described below in order to improve the electrical insulating properties and the mechanical strength of the composite member.

<Step (6)>

The pore of the porous body is loaded with an impregnating resin or an inorganic substance. The impregnating resin used in the present invention includes, for example, a curable resin such as epoxy resin, polyimide, BT resin, benzocyclobutene resin, or a crosslinked polybutadiene resin. On the other hand, the inorganic substance loaded in the pore of the porous body includes, for example, silica formed from silica sol, silsesquioxane or polysilazane.

If pores are present inside the insulator, the electrical insulating properties of the insulator tends to be impaired by the moisture absorption on the surface of the pore. However, where the pore is formed of a closed cell sufficiently smaller than the size of the conductive portion, i.e., smaller than the via diameter or the wiring width or the wiring pitch of the wiring, it is possible to maintain the insulating properties to some extent.

The material loaded in the pore of the porous insulator, which is not particularly limited in the present invention, includes, for example, the impregnating resin and the inorganic substance noted above. It is most desirable to use an impregnating resin in view of the loading capability, the adhesivity, etc. It is desirable to mix an inorganic filler of a nanometer order with the impregnating resin, if necessary.

It is possible to use as the inorganic filler metal oxides such as silica and alumina, metal nitrides such as silicon nitride and aluminum nitride, and metal ultra fine particles of platinum and palladium. It is possible to mix the inorganic filler with an impregnating resin and, then, to impregnate the porous insulator with the mixed impregnating resin. Alternatively, it is also possible to mix in advance a precursor of the inorganic filler with an impregnating resin, followed by impregnating the porous insulator with the mixture and, then, forming the inorganic filler within the pore of the porous insulator. It is possible to use effectively silsesquioxane or polysilazane as the precursor of the inorganic filler.

In the manufacturing method of the present invention, it is necessary to avoid as much as possible the formation of an organic compound having an ion-exchange group within the photosensitive composition layer other than the aimed portion in which the conductive portion is formed. Therefore, it is desirable to carry out the operations up to the plating step within a yellow room in which the light having a short wavelength is shielded.

In the method of the present invention for manufacturing a composite member, it is possible to use an insulator that can be removed easily, e.g., a thermally decomposable insulator. In this case, a conductive portion is formed first in a predetermined region of the insulator. Then, the porous body is removed by, for example, heating before the porous body is impregnated with an impregnating resin and cured by the method described previously. By employing the particular method, it is possible to manufacture a wiring board having vias and wirings formed in the cured material of the impregnating resin. In this case, the conductive portion is finally formed in a material differing from the insulator used for forming the conductive portion.

Incidentally, if the insulator is compressed by pressurizing the insulator in curing the impregnated resin, the porous body of the conductive portion is removed so as to collapse the void formed in the porous body, with the result that the conductive materials are bonded to each other. This is desirable because the conductivity of the conductive column can be improved.

In the composite member manufactured by the method of the present invention, an organic compound derived from the photosensitive composition remains in the interface between the insulator and the conductive portion. In this case, it is desirable to control the content of the organic compound per unit surface area on the surface of the insulator as described previously in conjunction with FIG. 2. As a result, it is possible to improve the adhesion force between the conductive portion and the insulator and to improve the electrical characteristics of the conductive portion.

To be more specific, in the composite member manufactured by the method of the present invention, the conductive portion 23 is partially formed via the organic compound 24 on the surface or in the inner region of the porous insulator 21 as shown in FIG. 2. It is desirable for the content of the organic compound 24 per unit surface area on the surface of the insulator 21 to meet the relationship given below. Specifically, the amount of the organic compound 24 present between the insulator 21 and the conductive portion 23 should be larger than the content of the organic compound 24 present in the region other than the region between the insulator 21 and the conductive portion 23.

In order to improve the humidity resistance of the composite member and to prevent the migration, it is desirable for the content of the organic compound 24 between the insulator 21 and the conductive portion 23 to be at least 5 times, preferably at least 10 times, as high as the content of the organic compound present in the region other than the region between the insulator 21 and the conductive portion 23.

In this case, it is possible for the organic compound 24 to be what is derived from the photosensitive composition used in the method of the present invention for manufacturing a composite member or to be another organic compound. Particularly, it is desirable for the insulator 21 and the photosensitive composition to differ from each other in construction because the insulator is not deteriorated upon irradiation with light and the material selection of the insulator is not limited.

For example, where the present invention is applied to a multi-layered wiring board, it is possible for the insulating portion to be formed of the general purpose resins such as an epoxy resin, a phenolic resin and a bismaleimide-triazine (BT) resin or heat resistant polymers such as polyimide, polyamide, polyally ether, polyallylate and polyether sulfone. Also, where it is desired to lower the dielectric constant of the insulating portion, it is possible to use a polytetrafluoroethylene (PTFE)-series polymer, benzocyclobutene (BCB) resin, etc. In short, the insulating material can be selected appropriately depending on the use. What should also be noted is that, since the insulator is unlikely to receive damages such as photo-deterioration in the light exposure step, it is possible to set freely the thickness of the insulator, etc.

It is possible to manufacture a multi-layered wiring board by using the composite member manufactured by the method of the present invention. How to manufacture a multi-layered wiring board by using the composite member of the present invention will now be described with reference to FIG. 4.

Figure 4:
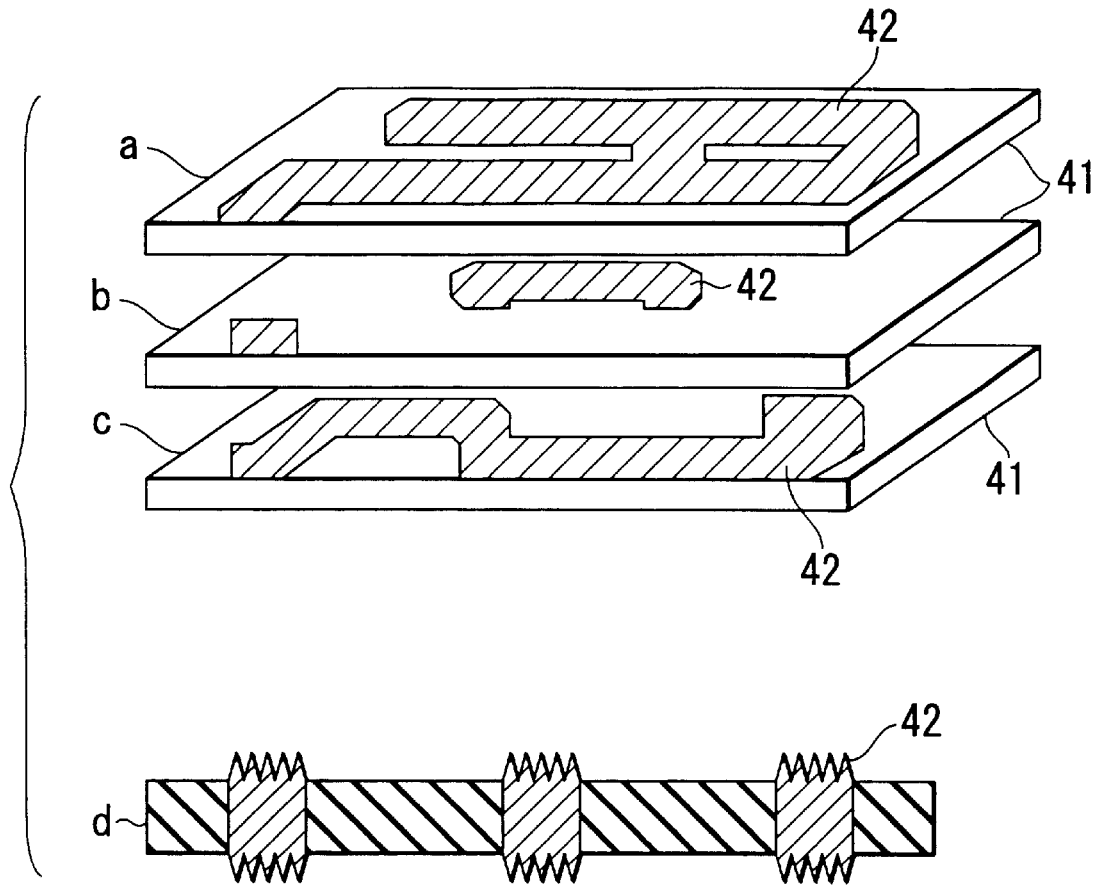
FIG. 4 schematically shows a composite body used for manufacturing a multi-layered substrate.

Specifically, FIG. 4 is an oblique view and a cross sectional view collectively showing a composite member used for the manufacture of a multi-layered wiring board. In the first step, a composite member is manufactured by the method of the present invention. As shown in FIG. 4, a conductive portion 42 forming a wiring pattern is formed on the surface and/or in the inner region of a porous insulator 41 in each of sheet-like composite members a, b and c. Also, another conductive portion 42 forming a via pattern is formed on the surface and/or in the inner region of the porous insulator 41 in a sheet-like composite member d. It is possible for the via pattern and the wiring pattern to be formed in the same sheet like the composite member b.

As apparent from composite member d having a via pattern formed therein, it is desirable for the end face of the conductive portion 42 forming a via to have a sharp zigzag structure projecting from the sheet surface because a good connection can be achieved between the via and the wiring.

It is also possible to coat the end face of the via with a solder. It is more desirable for the end face of the via to have a sharp zigzag structure in this case, too. It should be noted, however, that, in the case of employing a soldering, the flux is evaporated so as to cause voids in the step of lamination. Therefore, it is desirable to form a sharp zigzag structure in the end face of the via by using a relatively hard metal such as a nickel alloy. Where the end face of the via is flat, the end face is covered with the impregnated resin so as to impair the electrical connection. The sharp zigzag structure can be formed by, for example, applying a needle-like plating of a Cu/Ni eutectic alloy system.

A multi-layered wiring board having a three dimensional wiring formed therein can be obtained by alternately laminating the composite members a, b, c having wiring patterns formed therein and the composite member d having a via pattern formed therein a plurality of times.

A multi-layered wiring board can be manufactured by preparing first a plurality of composite members each having a wiring pattern or a via pattern formed therein, followed by collectively laminating these composite members one upon the other. Alternatively, a multi-layered wiring board can be manufactured by repeating the process of superposing a porous body, in which a wiring pattern or a via pattern is not formed, on a composite member having a wiring pattern or a via pattern formed therein, followed by applying a light exposure and plating so as to form a wiring pattern.

It is desirable to apply a contact bonding to the composite members included in the multi-layered wiring board so as to laminate the composite members one upon the other. In applying the contact bonding, it is possible to insert an adhesive layer between adjacent sheets of the composite members.

Further, if an impregnating resin such as an epoxy resin, polyimide, BT resin, or benzocyclobutene resin is loaded in the porous body and cured after the contact bonding, it is possible to form a stronger multi-layered wiring board. Of course, it is possible to load an inorganic substance such as silica formed from silica sol, silsesquioxane, or polysilazane in addition to the impregnating resin. It is certainly possible to impregnate the porous body with an impregnating resin before the contact bonding step, followed by curing the impregnating resin while applying the contact bonding. In this case, however, it is possible for the end face of the via to be covered with the impregnating resin.

It is possible to markedly diminish the step between the wiring portion and the non-wiring portion by forming the wiring pattern in a manner to form a composite body with the porous film-like insulator. Since such a step can be eliminated, it is possible to laminate easily a plurality of composite members depending on the case. Further, it is possible to make the composite member thinner and to increase the number of composite members laminated in the multi-layered wiring board. Particularly, where the thickness of the porous film-like insulator is as thin as several microns, these effects can be produced prominently.

As described above, a multi-layered wiring board can be manufactured in the present invention by laminating a composite member having a wiring layer formed therein and another composite member having a via formed therein. However, the present invention is not limited to the embodiment described above. For example, it is also possible to manufacture a multi-layered wiring board by laminating a plurality of composite members each having both a wiring pattern and a via formed therein.

Figure 5:
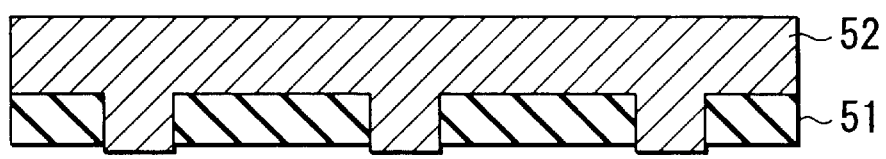
FIG. 5 is a cross sectional view showing a composite member used for the manufacture of a multi-layered wiring board.

FIG. 5 is a cross sectional view showing a composite member having a wiring pattern and a via formed therein. In the composite member shown in FIG. 5, a wiring pattern and a via are formed in a single member by forming conductive portions differing from each other in depth in a sheet-like porous insulator 51. In the case of manufacturing a multi-layered wiring board by using such a composite member, it is possible to decrease the number of composite members that are laminated one upon the other so as to simplify the manufacturing process.

In order to form conductive portions differing from each other in depth in a sheet-like porous insulator, the penetration length of the light for the light exposure into the sheet-like porous insulator, i.e., porous insulating sheet, is controlled by controlling the absorbance of the porous insulating sheet relative to the light for the light exposure such that the penetration length of the light is positioned within the porous insulating sheet in the thickness direction of the sheet. By using the particular exposing light, the wiring pattern is exposed to the light emitted from one side, and the via pattern is exposed to the light emitted from the other side. Then, an electroless plating is applied so as to obtain a composite member having both the wiring pattern and the via formed therein. Alternatively, it is possible to expose the via pattern to light of a wavelength, which is less absorbed by the porous insulator. It is possible to form the inner via very easily by employing the methods described above. What should be noted is that, since the wiring pattern and the via are prepared in principle by the same process, the manufacturing process can be simplified. If the wiring pattern is exposed to light on both sides of the insulator, it is possible to manufacture a double-sided wiring board.

As described above, the method of the present invention makes it possible to manufacture a composite member in which fine vias and wirings are formed freely and with a high accuracy. The composite member thus manufactured is excellent in its mechanical properties and electrical insulating properties.

Incidentally, in the multi-layered wiring board prepared by laminating a plurality of composite members, it is desirable for a layer 35 consisting of a conductor that does not contain an insulating component to be formed on each of the outermost surfaces of the conductive portions 32 and 33 of each composite member, as shown in FIG. 3. Where the layer 35 consisting of a conductor that does not contain an insulating component is formed on each of the outermost surfaces of the conductive portions 32 and 33 of substrate, the contact state between conductive portions can be improved and, thus, the presence the layer 35 is effective for lowering the resistance of the conductive portions.

As the layer 35 consisting of a conductor that does not contain an insulating component and formed on the outermost surfaces of each of the conductive portions 32 and 33, it is desirable to use a layer of a metal such as copper having a low resistivity. Not to contain an insulating component denotes that the content of the insulating component in the conductor is not higher than 5% in terms of the volume fraction. It is desirable for the thickness of the layer 35 to be not larger than 20 $\mu$m, particularly not larger than 10 $\mu$m, in view of the flatness of each layer. Also, it is desirable for the thickness of the layer 35 to be 1 to 50%, preferably 5 to 20%, of the thickness of the conductor formed in the porous body containing an insulating component. If the layer 35 is unduly thick, the difference in level from the conductor portion is increased so as to make it difficult to achieve lamination. On the other hand, if the thickness of the layer 35 is unduly small, a sufficient effect of lowering the resistance of the conductor portion cannot be obtained.

The layer 35 made of a conductor can be formed by applying the electroless plating employed in step (1) described previously for a long time. Alternatively, the conductor layer 35 can be formed by forming a patterned conductor portion within the insulator, followed by dipping again the insulator in a plating bath. In order to impart a degree of freedom to the shape of the outermost surface of the conductor portion, it is desirable to attach a metal foil to the end face of the conductor portion.

In order to obtain a multi-layered wiring board of the particular construction, a porous sheet is exposed first to light, followed by applying a plating so as to form a conductive portion consisting of a wiring portion and a via portion. Then, the surface of the porous sheet other than the conductive portion is coated with an adhesive such as an epoxy resin or polyimide (polyamic acid) so as to achieve bonding of the metal foil and the connection between the conductive portion and the metal foil.

The coating of the adhesive can be performed by a silk screen method, an ink jet method, etc. Before coating of the adhesive, it is desirable to apply a solder plating to the end face of the conductor portion.

After the bonding with the metal foils, the metal foils on both sides of the porous sheet are processed by an ordinary method such as a subtracting method so as to form a circuit pattern. A multi-layered wiring board can be manufactured by pouring an appropriate impregnating resin into each composite member, followed by laminating the composite members by hot pressing.

Alternatively, a metal foil (copper foil) is attached to the lower surface of the porous film, followed by forming a conductive portion in a desired pattern within the porous film by the light exposure and plating. Then, another metal foil (copper foil) is attached to the upper surface of the porous film so as to achieve an electrical connection to the conductive portion and to the metal foils attached to the upper and lower surfaces of the porous film, followed by patterning the copper foils on the upper and lower surfaces of the porous sheet so as to form a circuit pattern and, thus, to obtain a desired composite member. A multi-layered wiring board can be obtained by laminating a plurality of composite members thus prepared by the method described previously.

Further, a layer of a conductor can be formed by employing various methods. For example, it is possible to transfer a metal wiring pattern formed in advance in place of the metal foil so as to be bonded to the porous film and, thus, to form a layer of a conductor.

Of course, the layer of the conductor brings about a difference in level so as to give rise to a problem in the laminating step. However, since the conductor layer and the conductive portion formed within the porous body collectively play the role of the electrical conduction, it is possible to decrease the thickness of the conductor layer. Particularly, in the wiring used for a high frequency, the conductive characteristics of the entire wiring depend greatly on the conductivity of the surface of the wiring because of the skin effect. It follows that a sufficient effect can be expected even if the thickness of the conductor layer is small. The multi-layered wiring board of the construction shown in FIG. 3 is adapted for such a use.

The method of the present invention for manufacturing a composite member can also be applied to the manufacture of the wiring between multi-layered chips of a semiconductor device in addition to the manufacture of a multi-layered wiring board and a three dimensional wiring board. To be more specific, the method of the present invention can be applied to the formation of an interlayer wiring used for laminating semiconductor chips each having pads formed on the upper and lower surfaces. For example, columnar wirings are formed to extend in the thickness direction of a sheet-like porous insulator in conformity, or not in conformity in particular, with the arrangement of the pads of the semiconductor chip. The wiring between two adjacent semiconductor chips can be formed by inserting a sheet having the columnar wirings formed therein into a region between two semiconductor chips and laminating the resultant structure. It is possible to remove later the sheet by an oxygen ashing or a thermal decomposition. Further, after removal of the porous sheet, it is possible to densify the wiring that was made porous by an electroplating or an electroless plating.

Further, the composite member manufactured by the method of the present invention can be combined with a wiring substrate such as a glass epoxy substrate. The wiring substrate used includes, for example, a resin sheet prepared by impregnating a reinforced fiber such as a glass cloth manufactured by the known method or an unwoven fabric of an aramid fiber with an impregnating resin. By combining the composite member manufactured by the method of the present invention with a wiring substrate, it is possible to ensure easily the required bending strength.

The present invention will now be described with reference to Examples of the present invention. Of course, the technical scope of the present invention is not limited by the following Examples.

EXAMPLE 1

Formation of Wiring Pattern on Insulator Surface

Bismaleimide-triazine resin sheet was prepared as an insulator. On the other hand, a photosensitive composition solution having a concentration of 1% by weight was prepared by dissolving a phenolic resin containing naphthoquinone diazide (naphthoquinone diazide content of 33 equivalent mol %) in acetone. The molecular weight of the phenolic resin used was 2500. The resin sheet was coated with the resultant solution by a spin coating method so as to form a coated film having a thickness of $0.1 \mu m$. Further, the coating was dried at room temperature for 30 minutes so as to form a photosensitive composition layer.

Then, the resin sheet was exposed to light having a wavelength of 436 nm with a light amount of 500 mJ/cm$^2$ by using CANON PLA501 and a mask having a line width of $10 \mu m$ and a space width of $30 \mu m$ so as to form a latent image consisting of indene carboxylic acid.

Further, the resin sheet having a patterned latent image formed thereon was kept dipped in an aqueous solution of copper sulfate adjusted at 0.5M for 5 minutes, followed by washing with distilled water, which was repeated three times. The pH value of the copper sulfate aqueous solution was 4.1. The resin sheet after the washing was kept dipped in an aqueous solution containing 0.01M of sodium borohydride for 30 minutes, followed by washing with distilled water so as to obtain a composite member. A patterned conductor portion made of copper and having a line width of $10 \mu m$ and a space width of $30 \mu m$ like the mask was formed in the composite member thus obtained.

Figure 6:
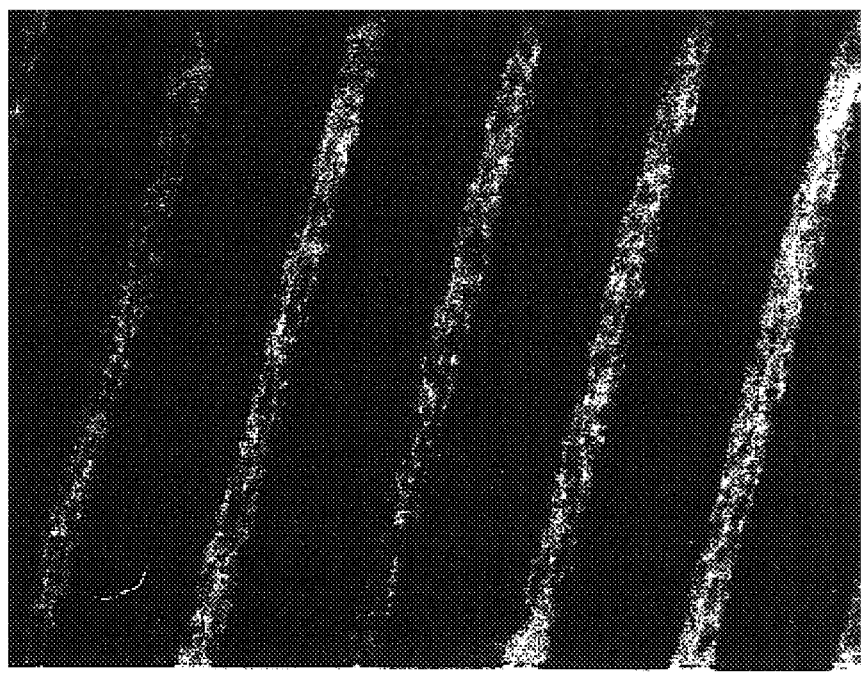
FIG. 6 is a photo showing the conductive portion of the composite member obtained in Example 1.

FIG. 6 is an optical micrograph observed from the surface of the conductive portion included in the composite member obtained in this Example. The micrograph is a reflecting optical micrograph having a magnification of 180.

Incidentally, an acid dyeing test was conducted by using tetrabromophenol blue in respect of a cross section of the composite member obtained in this Example. Carboxylic acid derived from indene carboxylic acid was found to be present in the interface between the conductor portion and the insulator. In this composite member, indene carboxylic acid was not recognized in the portion other than the interface between the insulator and the conductor portion.

Further, the composite member thus obtained, i.e., a porous sheet having a conductor pattern formed therein, was kept dipped in an electroless plating solution PS-503 for 30 minutes so as to apply a copper plating to the conductor portion, thereby forming a wiring pattern.

The adhesion properties between the conductor portion and the insulator were evaluated as follows. In the prior art, multi-layered wiring boards in which the plated metal has a peel strength of about 1.0 kN/m at room temperature are readily available on the marked. In a composite member of a BT resin sheet-Cu layer structure obtained under the conditions similar to those described above, the peel strength was measured under the conditions that the BT resin sheet was fixed and the Cu portion was pulled in a direction of 90° at a rate of 50 nm/min. The peel strength was found to be 1.9 kN/m, supporting that the adhesion properties between the conductor portion and the insulator was satisfactory, compared with the prior art noted above. It has been clarified that, in the composite member manufactured by the method of the present invention, the photosensitive composition performs a sufficient function of an adhesive layer.

EXAMPLE 2

Formation of Wiring Pattern on Porous Insulator

A PTFE porous film having a pore diameter of 500 nm and a thickness of $20 \mu m$ was used as an insulator, and the entire surface of the film was coated by a dipping method with a solution of the photosensitive composition equal to that used in Example 1. By this operation, the inner surface of the pore within the porous film was covered with a phenolic resin containing naphthoquinone diazide. Then, a composite member, i.e., a porous sheet having a conductive pattern formed therein, was prepared by the operation similar to that employed in Example 1 by using a mask having a dot diameter of $50 \mu m$ and a space of $50 \mu m$. In the composite member thus prepared, a conductor portion having a dot diameter of $50 \mu m$ and a space of $50 \mu m$ was formed over the entire inner region of the insulator.

EXAMPLE 3

Electroless Plating Treatment

The porous sheet having a conductor pattern formed therein, which was obtained in Example 2, was kept dipped in an electroless plating solution PS-503 for 30 minutes so as to apply a copper plating to the conductor portion and, thus, to obtain a wiring pattern. A similar pattern was also formed on the back surface of the porous film.

Figure 7:
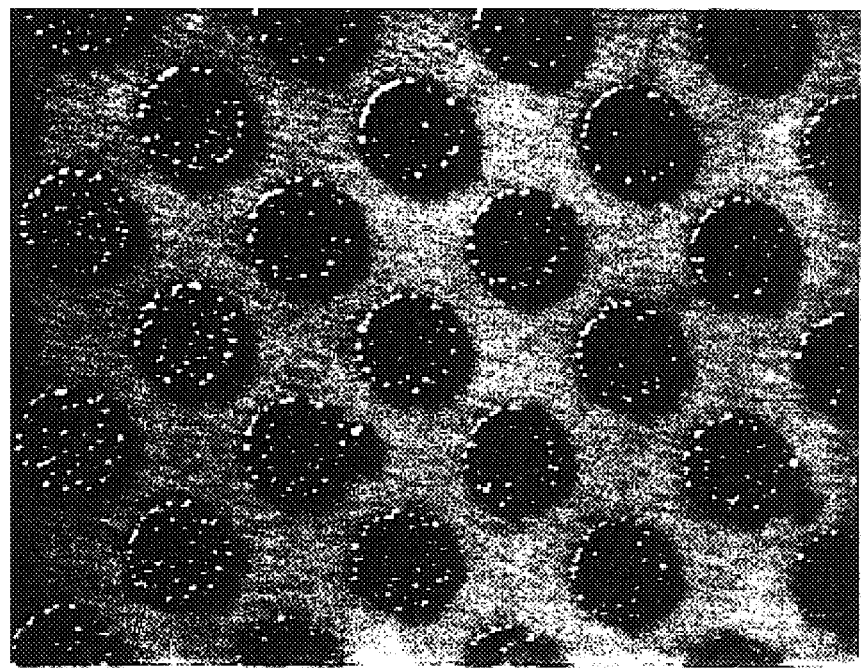
FIG. 7 is a photo showing the conductive portion of the composite member obtained in Example 3.

FIG. 7 is an optical micrograph observed from the surface of the wiring pattern in the composite member obtained in this Example. The optical micrograph is a reflecting optical micrograph having a magnification of 180.

In the composite member obtained in this Example, carboxylic acid derived from indene carboxylic acid present in the interface between the conductor portion and the insulator and in the region other than the interface between the insulator and the conductor portion was observed as in Example 1. Carboxylic acid derived from indene carboxylic acid was observed in only the interface between the insulator and the conductor portion. Also, the adhesion between the conductor portion and the insulator was satisfactory.

EXAMPLE 4

Double-sided Printed Circuit Board

Prepared was an NMP solution containing a mixture of bis(4-maleimide phenyl methane) and a graft copolymer between polyamic acid represented by the general formula given below and polyethylene oxide. The molecular weight of the polyethylene chain was about 20,000. The weight ratio of the polyamic acid component to the polyethylene oxide component was 2:5. Further, the mixing ratio of the graft copolymer to bis(4-maleimide phenyl methane) was 7:1 by weight ratio.

diameter of 50 μm and a space of 50 μm so as to form a latent image consisting of indene carboxylic acid.

Further, the resin sheet having a patterned latent image formed thereon was kept dipped in an aqueous solution of copper sulfate adjusted at 0.5M for 5 minutes, followed by washing with distilled water, which was repeated three times. The pH value of the copper sulfate aqueous solution was 4.1. The resin sheet after the washing was kept dipped in an aqueous solution containing 0.01M of sodium borohydride for 30 minutes, followed by washing with distilled water. After the washing, the sheet was kept dipped in an electroless copper plating solution PS-503 for 30 minutes so as to apply a copper plating to the conductor portion and, thus, to obtain a composite member. A conductor portion made of copper and having a dot diameter of 50 μm and a space of 50 μm like the mask was formed in the resultant composite member.

EXAMPLE 5

Double-sided Printed Circuit Board

A polyimide porous sheet having a thickness of 10 μm was prepared as in Example 4. Continuous pores each having a pore diameter of about 0.2 μm and extending in a three dimensional direction were formed in the polyimide porous sheet.

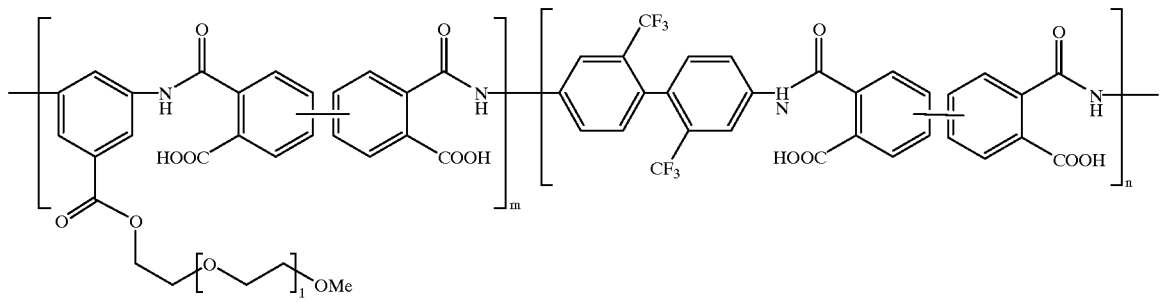

A sheet was prepared by a casting method from the solution. The temperature of the sheet thus prepared was elevated from room temperature to 150° C. over 30 minutes under a nitrogen gas stream, and the sheet was kept heated at 150° C. for one hour. Then, the temperature was elevated to 250° C. over 30 minutes, and the sheet was kept heated at 250° C. for one hour. Further, the temperature was elevated to 350° C. over 30 minutes, and the sheet was kept heated at 350° C. for one hour so as to obtain a polyimide porous sheet having a thickness of 10 μm.

The sheet after the heat treatment was observed with a transmission electron microscope, finding that continuous pores each having a pore diameter of about 0.2 μm were formed to extend in a three dimensional direction.

On the other hand, a solution having a concentration of 1% by weight was prepared by dissolving a phenolic resin containing naphthoquinone diazide (naphthoquinone diazide content of 33 equivalent mol %) in acetone. The molecular weight of the phenolic resin used was 2500. The entire surface of the polyimide porous sheet was coated with the resultant solution by a dipping method so as to form a coated film. By this operation, the inner surface of the pore within the porous sheet was covered with the phenolic resin containing naphthoquinone diazide.

Then, the polyimide porous sheet was exposed to light having a wavelength of 436 nm with a light amount of 3 J/cm$^2$ by using CANON PLA501 and a mask having a dot A via sheet was formed in the resultant porous sheet as in Example 4 by using a mask having a pattern of 50 μm as a via diameter. Then, a solder plating was applied to the end face of the via so as to obtain a via sheet. Also, a wiring sheet having a line width of 30 μm was prepared similarly by using a similar porous sheet.

Further, the via sheets and the wiring sheet were laminated one upon the other such that the vias and the wiring were electrically connected to each other, thereby forming a via sheet/wiring sheet/via sheet structure, followed by heating and pressurizing the laminate structure by using a heat pressing machine, thereby obtaining a multi-layered wiring board.

EXAMPLE 6

A polyimide porous sheet having a thickness of 40 μm was prepared as in Example 4. Continuous pores each having a diameter of about 0.2 μm and extending in a three dimensional direction were formed in the polyimide porous sheet.

A via sheet was formed in the resultant porous sheet as in Example 4 by using a mask having a pattern of 50 μm as a via diameter. Then, a solder plating was applied to the end face of the via so as to obtain a via sheet. Also, a wiring sheet having a line width of 30 μm was prepared similarly by using a similar porous sheet. After formation of the conductive portion by a method similar to that in the case of forming the via sheet, a solder plating was applied to the wiring sheet, too.

The surface portions other than the conductor portions of the via sheet and the wiring sheet were coated with a polyimide varnish by a silk screen method.

On the other hand, a stainless steel plate having a thickness of 0.3 mm was coated by a spin coating method with a positive photoresist available on the market so as to form a photoresist film having a thickness of 0.2 $\mu$m. The photoresist film thus obtained was subjected to a light exposure, followed by development so as to prepare a substrate for the via transfer and another substrate for the wiring pattern transfer. In preparing the substrate for the via transfer, the light exposure was performed by using mask having a via diameter of 55 $\mu$m. On the other hand, in preparing the substrate for the wiring pattern transfer, the light exposure was performed by using mask having a line width of 33 $\mu$m. These masks were equal in pitch to the via and the wiring pattern formed in the porous sheet.

These transfer substrates were arranged to face a copper electrode and dipped in a copper sulfate plating bath so as to apply an electroplating for 15 minutes under a current density of 2 A/dm$^2$. The pH value of the copper sulfate plating bath was 4.1. Copper was precipitated in a thickness of about 5 $\mu$m in the photoresist-removed portion in each of the transfer substrates so as to form a metal pattern. The transfer substrate having the metal pattern formed thereon was used as an original plate for the metal transfer.

A via sheet having a corresponding pattern shape and the metal transfer original plate arranged to permit the conductor portion formed in the porous sheet to correspond to the metal pattern of the metal transfer original plate were subjected to a contact bonding at 150° C. so as to transfer the metal portion of the transfer original plate onto the porous sheet. Likewise, the metal portion of the transfer original plate was transferred in respect of the wiring sheet.

Further, the via sheets and the wiring sheet were laminated one upon the other such that the vias and the wiring were electrically connected to each other, thereby forming a via sheet/wiring sheet/via sheet structure, followed by heating and pressurizing the laminate structure by using a heat pressing machine, as in Example 5. As a result, obtained was a multi-layered wiring board as shown in FIG. 3.

The resistance at the upper end and the lower end of the laminated sheet was found to be 1 m$\Omega$.

EXAMPLE 7

Anisotropic Conductive Sheet

A sharp zigzag structure having a height of 2 to 3 $\mu$m was formed on the end face of a copper column by applying a plating of a Cu/Ni series eutectic alloy in respect of the PTFE porous sheet having a conductive pattern formed therein, which was prepared as in each of Examples 2 and 3. A resin composition used for impregnation in the PTFE porous sheet having copper columns formed therein was prepared as follows.

Specifically, a reaction between an equivalent of 3,3',4,4'-benzophenone tetracarboxylic acid dianhydride and an equivalent of 2,2'-bis[4-(p-aminophenoxy)phenyl]propane was carried out in dimethyl acetamide so as to prepare a polyamic acid varnish. Then, an impregnating solution was prepared by adding 30% by weight of 2,2-bis[4-(4-maleimidephenoxy)phenyl] to the polyamic acid thus prepared.

The PTFE porous sheet having copper columns formed therein was impregnated with the impregnating solution thus obtained, followed by drying with a hot air so as to remove the solvent. Then, heating was applied at 200° C. for 30 minutes so as to obtain an adhesive anisotropic conductive film.

EXAMPLE 8

Formation of Wiring Pattern in Porous Insulator

A solution of an organic photosensitive composition was prepared by dissolving 5 g of a compound having a chemical structure (II) given below and having a molecular weight of 10,000, 0.1 g of N-hydroxynaphthylimide trifluoromethane sulfonate and 0.04 g of cyclohexyl amine used as an acid generating agent in 100 g of methoxy methyl propionate.

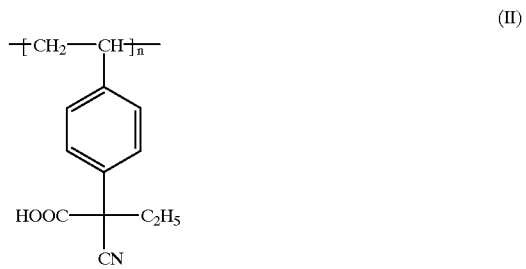

(II)

A PTFE porous film having a pore diameter of 500 nm and a thickness of 20 $\mu$m was prepared as the insulator. After the entire surface of the PTFE porous film was coated by a dipping method with the solution of the organic photosensitive composition prepared as above, a baking was applied at 100° C. for 90 seconds, followed by applying a light exposure as in Example 1 by using a mask having a line width of 50 $\mu$m and a space width of 100 $\mu$m. Further, after application of PEB (post exposure baking) at 140° C. for 15 minutes, a conductive pattern-forming process was performed as in Example 1 so as to obtain a composite member. A conductive portion having a line width of 100 $\mu$m and a space width of 50 $\mu$m was formed over the entire inner region of the composite member thus obtained.

EXAMPLE 9

A solution of an organic photosensitive composition was prepared by dissolving 0.9 g of phenolic resin containing naphthoquinone diazide in an amount of 33 equivalent mol % and 0.5 g of poly(ethylene-carbodiimide) in 100 ml of acetone. The molecular weight of the phenolic resin was 2500. A composite member was prepared as in Example 1 by using the solution thus prepared. A good pattern was formed in the composite member thus obtained, as in Example 1.

A heat treatment was applied to the composite member at 80° C. for one hour and, then, a peel strength was evaluated. The peel strength was found to be 2.6 kN/m.

EXAMPLE 10

A solution of an organic photosensitive composition having a concentration of 1% by weight was prepared by dissolving poly(p-nitrobenzyl-p-vinyl benzene carbonate-co-styrene) in toluene. The molecular weight of the resin used was 15,000. A wiring pattern was formed in a PTFE porous film as in Example 2, except that the particular solution noted above was used in the Example. As a result, obtained was a good conductor pattern exactly equal to the mask.

EXAMPLE 11

Diblock copolymer between poly(vinyl styrene) and poly (methyl methacrylate) was synthesized by a living anion polymerization method. The weight average molecular weight Mw of the diblock copolymer thus obtained was 287,000. The molecular weight of poly(vinyl styrene) was 91,000. The molecular weight of poly(methyl methacrylate) was 196,000. Further, a ratio Mw/Mn was 1.10. Then, 1.7% by weight of 3,3'4,4'-tetra-(t-butyl peroxy carbonyl) benzophenone used as a radical generating agent was added to the diblock copolymer thus prepared, and the resultant mixture was dissolved in cyclohexanone so as to prepare a solution having a concentration of 10% by weight.

A PTFE plate was coated with the cyclohexanone solution thus prepared by using an applicator, followed by drying the coating so as to obtain a film having a thickness of 15 $\mu$m. The film thus obtained was subjected to a heat treatment at 135° C. for 24 hours under a nitrogen gas stream. After the heat treatment, the film was irradiated with β-rays at 160 KGy under an accelerating voltage of 2 MV. After the irradiation, the film was washed with ethyl lactate so as to obtain a porous film of crosslinked poly(vinylethylene).

The porous film thus obtained was observed with a transmission electron microscope so as to recognize continuous pores each having a pore diameter of about 50 $\mu$m and extending in a three dimensional direction.

On the other hand, a solution of a photosensitive composition having a concentration of 0.5% by weight was prepared by dissolving a phenolic resin containing naphthoquinone diazide in an amount of 33 equivalent mol % in acetone. The porous film referred to previously was impregnated with the acetone solution, followed by drying the impregnated porous film at room temperature so as to obtain a sheet. The sheet thus obtained was selectively exposed to light through a mask by using CANON PLA501 to form a wiring pattern and a via pattern, thereby forming a latent image consisting of indene carboxylic acid. The wiring pattern had a line width of 20 $\mu$m and a space width of 30 $\mu$m. Also, the via diameter was 10 $\mu$m. The light exposure was performed by using light having a wavelength of 436 nm under a light amount of 500 mJ/cm$^2$.

Further, the resin sheet having a patterned latent image formed thereon was kept dipped in an aqueous solution of copper sulfate adjusted at 0.5M for 5 minutes, followed by washing with distilled water, which was repeated three times. The pH value of the copper sulfate aqueous solution was 4.1. The resin sheet after the washing was kept dipped in an aqueous solution containing 0.01M of sodium borohydride for 30 minutes, followed by washing with distilled water. After the washing, the sheet was kept dipped in an electroless copper plating solution PS-503 for 30 minutes so as to apply a copper plating to the conductor portion and, thus, to obtain a porous sheet in which were formed a wiring pattern and a via pattern each made of copper.

Further, in the porous sheet (wiring sheet) having a wiring pattern formed therein, a layer made of copper alone and having a thickness of 2 $\mu$m was formed on the end face of the wiring pattern by applying an electroless plating. Also, in the porous sheet (via sheet) having a via pattern formed therein, a sharp zigzag projection structure having a height of 2 to 3 $\mu$m was formed by applying a plating of a Cu/Ni eutectic alloy to the end face.

A laminate structure consisting of two wiring sheets and a single via sheet sandwiched between the two wiring sheets was prepared and impregnated with a resin solution. The impregnating resin solution was prepared by adding 50 parts by weight of methyl isobutyl ketone to 100 parts by weight of XU13005 (trade name of a benzocyclobutene resin solution manufactured by Dou Chemical Inc.). The laminate body of the sheet was subjected to a contact bonding and, then, the solvent was removed from the laminate body. Further, the laminate body was subjected to a thermal curing at 240° C. for one hour under a nitrogen gas stream so as to obtain a double-sided wiring board.

Similarly, a multi-layered wiring board of a four layer structure was prepared by alternately laminating four wiring sheets and three via sheets. Also prepared was a multi-layered wiring board of a six layer structure by laminating a single via sheet and a single wiring sheet on the upper and lower surfaces, respectively, of an FR-4 glass epoxy substrate of four layer structure having a wiring width of 75 $\mu$m. Further, a multi-layered wiring board of an eight layer structure was prepared by using two via sheets and two wiring sheets in addition to the substrate of a four layer structure.

In each of the multi-layered wiring boards thus prepared, a layer made of copper alone was formed on the end face of the conductor portion of the wiring board. Therefore, each of these multi-layered wiring boards exhibited a resistance lower than that of the multi-layered wiring board in which a copper layer was not formed on the end face of the conductor portion. On the other hand, the multi-layered wiring board including the glass epoxy substrate as the core layer was found to be excellent in the bending strength.

EXAMPLE 12

A polyimide porous sheet having a thickness of 20 $\mu$m was prepared as in Example 4. Continuous pores each having a pore diameter of about 0.2 $\mu$m were found to be formed in the polyimide porous sheet in a manner to extend in a three dimensional direction.

On the other hand, a solution of an organic photosensitive composition was prepared by dissolving 10 g of a phenol novolak resin derivative having the OH group capped by a tert-butoxy carbonyl methyl group, 0.5 g of DTBPI-TF (bis(4-tert-butylphenyl)iodonium trifluoromethane sulfonate and 0.08 g of acridine orange, which were used as an acid generating agent in 200 g of methyl cellosolve.

Then, the polyimide porous body sheet prepared in advance was impregnated with the solution of the organic photosensitive composition, followed by drying at 80° C. for 10 minutes so as to obtain a polyimide porous body sheet covered with the organic photosensitive composition.

The sheet was exposed to light having a wavelength of 254 nm, which was emitted from a low pressure mercury lamp, with a light amount of 10 mJ/cm$^2$ through a mask of a wiring pattern having a line width of 50 $\mu$m and a space width of 50 $\mu$m. Then, the sheet after light exposure is heated at 100° C. for 5 minutes so as to form a latent image consisting of the phenol novolak resin containing the carboxyl group. The penetration depth of the pattern into the sheet was about 5 $\mu$m under the conditions noted above.

Then, a light exposure was applied by arranging a via pattern mask on the back surface of the sheet. In the via pattern mask used, via portions each having a diameter of 50 $\mu$m were arranged at a pitch of 100 $\mu$m. The via mask pattern was arranged such that the via portions extended through the line exposure portion depicted in the lower portion of the sheet. The resultant structure was exposed to light having a long wavelength of 546 nm with a light amount of 500 mJ/cm$^2$ by using CANON PLA501 so as to form a latent image consisting of the phenol novolak resin containing a carboxyl group.

In the sheet after the light exposure, formed was a latent image in which the via exposed portion extended to reach the line exposed portion.

Further, the sheet having a patterned latent image formed therein was washed with distilled water and, then, kept dipped in an aqueous solution of copper sulfate adjusted at 0.5M for 5 minutes, followed by washing with distilled water, which was repeated three times. The pH value of the copper sulfate aqueous solution was 4.1. The sheet after the washing was kept dipped in an aqueous solution containing 0.01M of sodium borohydride for 30 minutes, followed by washing with distilled water. After the washing, the sheet was kept dipped in an electroless copper plating solution PS-503 for 30 minutes so as to apply a copper plating to the conductor portion and, thus, to obtain a composite member having a wiring pattern of copper formed therein as shown in FIG. 5.

As described above in detail, the present invention has made it possible to form easily a conductor portion having a fine pattern, in which the degree of freedom is high in respect of the design of the conductor circuit, the insulator is not deteriorated by the light exposure, and the metal is not deposited abnormally on the insulator.

According to the present invention, it is possible to form easily a conductor portion having a fine pattern, in which the degree of freedom is high in respect of the design of the conductor circuit, the manufacturing cost is low, the material selectivity and the molding workability of the insulating portion are not adversely affected, and the metal is not deposited abnormally on the insulator.

According to the present invention, there is provided a photosensitive composition and an insulator that can be used in the manufacturing method of the composite member described above.

According to the present invention, there is provided a composite member manufactured by the method described above.

According to the present invention, there is provided a multi-layered wiring board comprising the composite member manufactured by the method described above.

Further, according to the present invention, there is provided an electronic package using the composite member or the multi-layered wiring board manufactured by the method described above.

The present invention can be suitably employed in various uses such as the manufacture of various optically functioning device and multi-layered wiring boards and, thus, has a very high industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a composite member in which a conductive portion is selectively formed in a porous insulating body containing pores contiguous to each other in a three dimensional direction, comprising:
   (1) forming a photosensitive composition layer on the surface of said pores of said insulating body, said photosensitive composition containing a compound forming an ion-exchange group upon irradiation with light having a wavelength not shorter than 280 nm;
   (2) exposing selectively the photosensitive composition layer to light having a wavelength not shorter than 280 nm so as to form ion-exchange groups in the light exposed portion; and
   (3) bonding a metal ion or metal to the ion-exchange group formed in the light exposed portion.

2. The method of manufacturing a composite member according to claim 1, wherein said insulating body is a porous body prepared from a micro phase separation structure.

3. The method of manufacturing a composite member according to claim 1, wherein the photosensitive composition contains a high molecular weight compound having a molecular weight not smaller than 1,000,
   and said compound forming an ion-exchange group upon irradiation with light is chemically bonded to said high molecular weight compound.

4. The method of manufacturing a composite member according to claim 1, wherein said conductive portion is formed by dipping said insulating body in an aqueous solution containing metal ions and having a pH value not larger than 7.

5. The method of manufacturing a composite member according to claim 1, wherein said metal or metal ion bonding to said ion-exchange groups is copper ion or copper.

6. The method of manufacturing a composite member according to claim 1, wherein said light reaches in the inner region of said porous body in a penetration thickness of said light to form said ion-exchange groups, said conductive portion is formed to said penetration thickness of said light.

7. The method of manufacturing a composite member according to claim 1, wherein said metal ion or metal bonding to said ion-exchange groups is copper ion.

8. The method of manufacturing a composite member according to claim 7, wherein the concentration of said copper ions in said aqueous solution falls within a range of between 0.001M and 10M.

9. The method of manufacturing a composite member according to claim 1, further comprising the step of electroless plating to the surface of said conductive portion.

10. The method of manufacturing a composite member according to claim 9, wherein said electroless plating is performed by using an electroless plating solution containing copper ions and at least one reducing agent selected from the group consisting of formaldehyde, hydrazine, sodium hypophosphite, sodium borohydride, ascorbic acid, and glyoxalic acid.

11. A method of manufacturing a composite member in which a conductive portion is selectively formed in a porous insulating body containing pores contiguous to each other in a three dimensional direction, comprising:
   (1) forming a photosensitive composition layer on the surface of said pores of said insulating body, said photosensitive composition containing a compound having an ion-exchange group;
   (2) exposing selectively the photosensitive composition layer to light having a wavelength not shorter than 280 nm so as to cause ion-exchange groups in the light exposed portion to disappear and to cause the ion-exchange groups to remain in the unexposed portion, and
   (3) bonding a metal ion or metal to the ion-exchange group remaining in the unexposed portion.

12. The method of manufacturing a composite member according to claim 11, wherein said insulating body is a porous body prepared from a micro phase separation structure.

13. The method of manufacturing a composite member according to claim 11, wherein the photosensitive composition contains a basic substance, a compound having a carboxyl group, which gives rise to a decarboxylation reaction upon irradiation with light in the presence of said basic substance, and a photo acid generating agent.

14. The method of manufacturing a composite member according to claim 11, wherein said conductive portion is formed by dipping said insulating body in an aqueous solution containing metal ions and a having a pH value not larger than 7.

15. The method of manufacturing a composite member according to claim 11, wherein said metal or metal ion bonding to said ion-exchange groups is copper ion or copper.

16. The method of manufacturing a composite member according to claim 11, wherein said light reaches in the inner region of said porous body in a penetration thickness of said light to form said ion-exchange groups, said conductive portion is formed to said penetration thickness of said light.

17. The method of manufacturing a composite member according to claim 11, wherein said metal ion or metal bonding to said ion-exchange groups is copper ion.

18. The method of manufacturing a composite member according to claim 17 wherein the concentration of said copper ions in said aqueous solution falls within a range of between 0.001M and 10M.

19. The method of manufacturing a composite member according to claim 11, further comprising the step of electroless plating to the surface of said conductive portion.

20. The method of manufacturing a composite member according to claim 19, wherein said electroless plating is performed by using an electroless plating solution containing copper ions and at least one reducing agent selected from the group consisting of formaldehyde, hydrazine, sodium hypophosphite, sodium borohydride, ascorbic acid, and glyoxalic acid.

21. A method of manufacturing a composite member in which a conductive portion is selectively formed in a porous insulating body containing pores contiguous to each other in a three dimensional direction, comprising:
  (1) forming a photosensitive composition layer on the surface of said pores of said insulating body, said photosensitive composition containing a compound forming an ion-exchange group upon irradiation with light, and said compound being selected from the group consisting of an onium salt derivative, a sulfonium ester derivative, a carboxylic acid derivative and a naphthoquinone diazide derivative;
  (2) exposing selectively the photosensitive composition layer to light so as to form ion-exchange groups in the light exposed portion; and
  (3) bonding a metal ion or metal to the ion-exchange group formed in the light exposed portion.

22. The method of manufacturing a composite member according to claim 21, wherein said insulating body is a porous body prepared from a micro phase separation structure.

23. The method of manufacturing a composite member according to claim 21, wherein the photosensitive composition contains a high molecular weight compound having a molecular weight not smaller than 1,000,
  and said compound forming an ion-exchange group upon irradiation with light is chemically bonded to said high molecular weight compound.

24. The method of manufacturing a composite member according to claim 21, wherein said conductive portion is formed by dipping said insulating body in an aqueous solution containing metal ions and having a pH value not larger than 7.

25. The method of manufacturing a composite member according to claim 21, wherein said metal or metal ion bonding to said ion-exchange groups is copper ion or copper.

26. The method of manufacturing a composite member according to claim 21, wherein said light reaches in the inner region of said porous body in a penetration thickness of said light to form said ion-exchange groups, said conductive portion is formed to said penetration thickness of said light.

27. The method of manufacturing a composite member according to claim 21, wherein said metal ion or metal bonding to said ion-exchange groups is copper ion.

28. The method of manufacturing a composite member according to claim 27, wherein the concentration of said copper ions in said aqueous solution falls within a range of between 0.001M and 10M.

29. The method of manufacturing a composite member according to claim 21, further comprising the step of electroless plating to the surface of said conductive portion.

30. The method of manufacturing a composite member according to claim 29, wherein said electroless plating is performed by using an electroless plating solution containing copper tons and at least one reducing agent selected from the group consisting of formaldehyde, hydrazine, sodium hypophosphite, sodium borohydride, ascorbic acid, and glyoxalic acid.

31. A method of manufacturing a composite member in which a conductive portion is selectively formed in a porous insulating body containing pores contiguous to each other in a three dimensional direction, comprising:
  (1) forming a photosensitive composition layer on the surface of said pores of said insulating body, said photosensitive composition containing a compound having an ion-exchange group;
  (2) exposing selectively the photosensitive composition layer to light so as to cause ion-exchange groups in the light exposed portion to disappear and to cause the ion-exchange groups to remain in the unexposed portion; and
  (3) bonding a metal ion or metal to the ion-exchange group remaining in the unexposed portion.

32. The method of manufacturing a composite member according to claim 31, wherein said insulating body is a porous body prepared from a micro phase separation structure.

33. The method of manufacturing a composite member according to claim 31, wherein the photosensitive composition contains a high molecular weight compound having a molecular weight not smaller than 1,000,
  and said compound allowing an ion-exchange group to disappear upon irradiation with light is chemically bonded to said high molecular weight compound.

34. The method of manufacturing a composite member according to claim 31, wherein said conductive portion is formed by dipping said insulating body in an aqueous solution containing metal ions and having a pH value not larger than 7.

35. The method of manufacturing a composite member according to claim 31, wherein said metal or metal ion bonding to said ion-exchange groups is copper ion or copper.

36. The method of manufacturing a composite member according to claim 31, wherein said light reaches in the inner region of said porous body in a penetration thickness of said light to form said ion-exchange groups, said conductive portion is formed to said penetration thickness of said light.

37. The method of manufacturing a composite member according to claim 31, wherein said metal ion or metal bonding to said ion-exchange groups is copper ion.

38. The method of manufacturing a composite member according to claim 37, wherein the concentration of said copper ions in said aqueous solution falls within a range of between 0.001M and 10M.

39. The method of manufacturing a composite member according to claim 31, further comprising the step of electroless plating to the surface of said conductive portion.

40. The method of manufacturing a composite member according to claim 39, wherein said electroless plating is performed by using an electroless plating solution containing copper ions and at least one reducing agent selected from the group consisting of formaldehyde, hydrazine, sodium hypophosphite, sodium borohydride, ascorbic acid, and glyoxalic acid.

41. A method of manufacturing a composite member in which a conductive portion is selectively formed in a porous insulating body containing pores contiguous to each other in a three dimensional direction, comprising:

(1) forming a photosensitive composition layer on the surface of said pores of said insulating body, said photosensitive composition containing a compound forming an ion-exchange group in the presence of acid and a photo acid generating agent;

(2) exposing selectively to light and heating the photosensitive composition layer so as to form ion-exchange group in the light exposed portion, and (3) bonding a metal ion or metal to the ion-exchange group formed in the light exposed portion.

42. The method of manufacturing a composite member according to claim 41, wherein said photosensitive composition comprises photosensitizer.

43. The method of manufacturing a composite member according to claim 41, wherein said insulating body is a porous body prepared from a micro phase separation structure.

44. The method of manufacturing a composite member according to claim 41, wherein the photosensitive composition contains a high molecular weight compound having a molecular weight not smaller than 1,000, and said compound forming an ion-exchange group upon irradiation with light is chemically bonded to said high molecular weight compound.

45. The method of manufacturing a composite member according to claim 41, wherein said conductive portion is formed by dipping said insulating body in an aqueous solution containing metal ions and having a pH value not larger than 7.

46. The method of manufacturing a composite member according to claim 41, wherein said metal or metal ion bonding to said ion-exchange groups is copper ion or copper.

47. The method of manufacturing a composite member according to claim 41, wherein said light reaches in the inner region of said porous body in a penetration thickness of said light to form said ion-exchange groups, said conductive portion is formed to said penetration thickness of said light.

48. The method of manufacturing a composite member according to claim 41, wherein said metal ion or metal bonding to said ion-exchange groups is copper ion.

49. The method of manufacturing a composite member according to claim 48, wherein the concentration of said copper ions in said aqueous solution falls within a range of between 0.001M and 10M.

50. The method of manufacturing a composite member according to claim 41, further comprising the step of electroless plating to the surface of said conductive portion.

51. The method of manufacturing a composite member according to claim 50, wherein said electroless plating is performed by using an electroless plating solution containing copper ions and at least one reducing agent selected from the group consisting of formaldehyde, hydrazine, sodium hypophosphite, sodium borohydride, ascorbic acid, and glyoxalic acid.

* * * * *